(12) United States Patent
Kanatzidis et al.

(10) Patent No.: US 11,754,730 B2
(45) Date of Patent: Sep. 12, 2023

(54) MERCURY CHALCOIODIDES FOR ROOM TEMPERATURE RADIATION DETECTION

(71) Applicant: Northwestern University, Evanston, IL (US)

(72) Inventors: Mercouri G. Kanatzidis, Wilmette, IL (US); Yihui He, Evanston, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 17/721,634

(22) Filed: Apr. 15, 2022

(65) Prior Publication Data
US 2022/0252742 A1 Aug. 11, 2022

Related U.S. Application Data

(62) Division of application No. 16/486,088, filed as application No. PCT/US2018/018318 on Feb. 15, 2018, now abandoned.

(60) Provisional application No. 62/459,880, filed on Feb. 16, 2017.

(51) Int. Cl.
*G01T 1/24* (2006.01)
*H01L 31/032* (2006.01)
*H01L 31/08* (2006.01)
*H01L 31/18* (2006.01)

(52) U.S. Cl.
CPC .............. *G01T 1/24* (2013.01); *H01L 31/032* (2013.01); *H01L 31/085* (2013.01); *H01L 31/18* (2013.01)

(58) Field of Classification Search
CPC ........... G01T 1/24; G01T 1/00; H01L 31/032; H01L 31/085; H01L 31/18; H01J 2237/2445
See application file for complete search history.

(56) References Cited

PUBLICATIONS

Ariesanti et al., Prismatic platelet growth of HgI2 with organic additives, 2011, IEE Nuclear Science Symposium Conference Record, pp. 4518-4523. (Year: 2011).*

Beck et al., "Synthesis and Crystal structure of Hg3S2I2 and Hg3.Se2I2, New members of the Hg3E2X2 family", Journal of Solid State Chemistry, vol. 151, pp. 73-76. (Year: 2000).*

\* cited by examiner

*Primary Examiner* — Kiho Kim
(74) *Attorney, Agent, or Firm* — Bell & Manning, LLC

(57) ABSTRACT

Methods and devices for detecting incident radiation, such as incident X-rays or gamma-rays, are provided. The methods and devices use single-crystalline mercury chalcoiodide compounds having the formula $Hg_3Q_2I_2$, where Q represents a chalcogen atom or a combination of chalcogen atoms, as photoelectric materials. Also provided are methods for growing single-crystals of the mercury chalcoiodide compounds using external organic chemical transport agents.

17 Claims, 27 Drawing Sheets

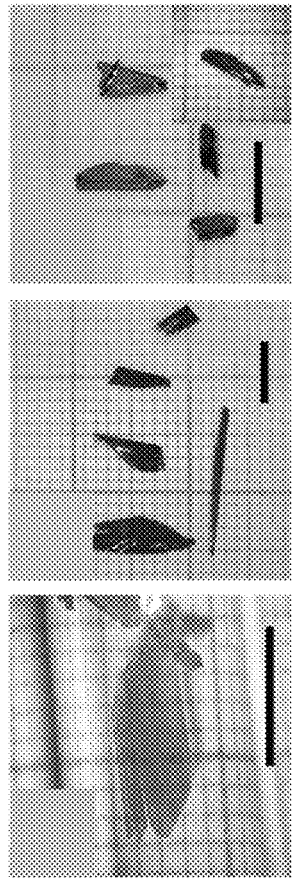
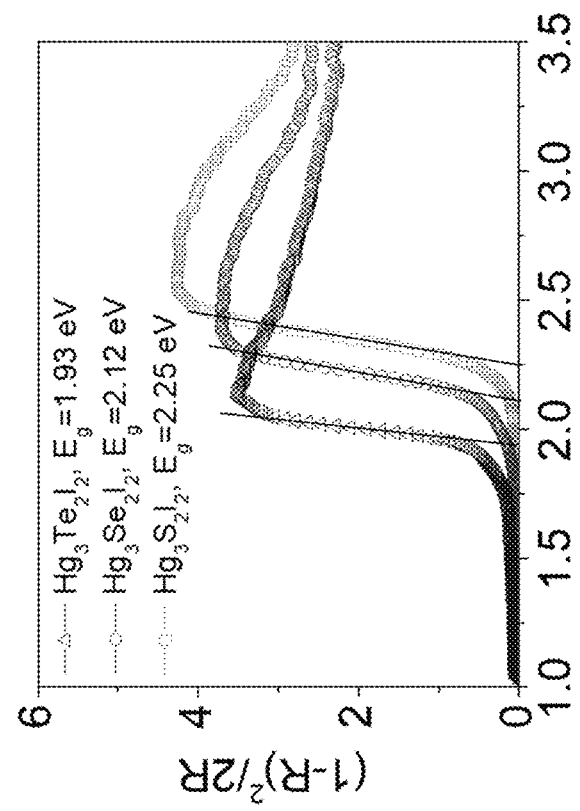
FIG. 3A  FIG. 3B  FIG. 3C  FIG. 3D

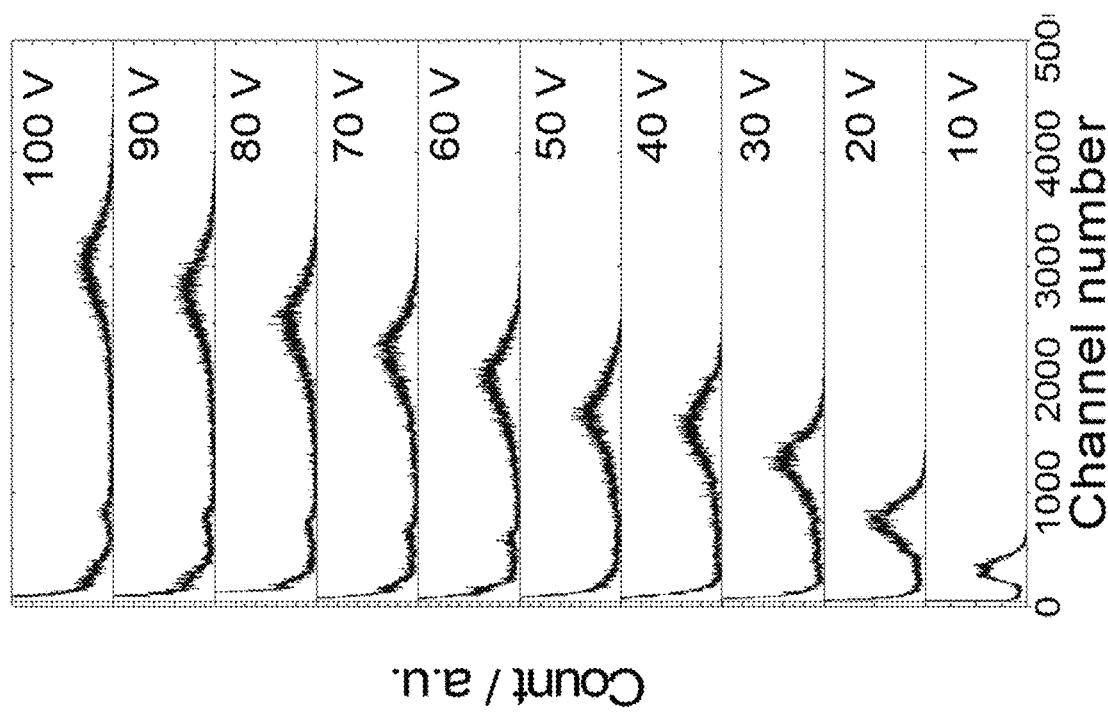

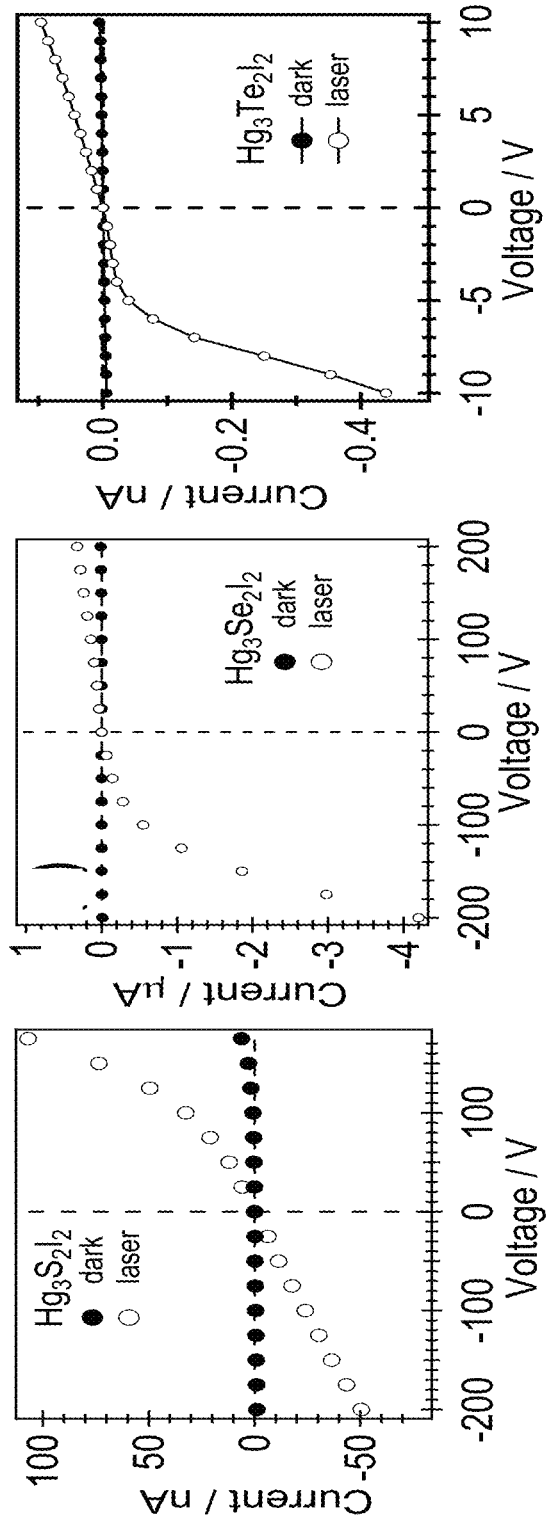

MERCURY CHALCOIODIDES FOR ROOM TEMPERATURE RADIATION DETECTION

CROSS-REFERENCE TO RELATED APPLICATIONS

This application is a Divisional of U.S. application Ser. No. 16/486,088, filed Aug. 14, 2019, which is a National Stage application that claims priority to International Application No. PCT/US2018/018318, filed Feb. 15, 2018, which claims the priority benefit of U.S. Patent Application No. 62/459,880, filed Feb. 16, 2017, the entire contents of the priority applications are incorporated by reference herein.

REFERENCE TO GOVERNMENT RIGHTS

This invention was made with government support under 2014-DN-077-ARI086-01 awarded by the Department of Homeland and Security. The government has certain rights in the invention.

BACKGROUND

Hard radiation detection at room temperature is now becoming a universal concern. There are both enormous and incremental demands for such X- and γ-ray detectors in the science of astronomy and applications of industrial and medical imaging as well as nuclear safeguard and national security[1]. Such radiation detectors are based on semiconductors and promise unparalleled capability for direct photoelectric conversion, with good spatial and energy resolution.[2-3] Therefore, there is a long-standing interest in developing new semiconductors for X- and γ-ray detection at room temperature.

Semiconductors for radiation detection must simultaneously satisfy several requirements to achieve hard radiation detection. For sufficient stopping power of high-energy photons, both high density and high Z elements are required, such as the heavy metals Cd, Hg, In, Tl, Sn, Pb, Sb and Bi.[4] Large bandgaps, in the range of 1.5-2.5 eV, are also required to keep low intrinsic carrier concentration and maintain low leakage current during detector operation at room temperature.[5] For conventional compound semiconductors, the general tendency of decreasing bandgap $E_g$ with increasing atomic number Z has severely confined the possibilities of new candidates.[6-7] As a result, to date only a few binary or pseudo-binary compounds have shown such functionality.[8-13] However, they all suffer from substantial drawbacks, such as growth issues or detector polarization problems. CdTe and CdTe-based pseudo-binary chalcogenides, such as CdZnTe (CZT), have been considered as the most promising room temperature radiation detection materials to date. However, due to the high cost and growth issues (mainly microstructural defects), the yield and device applications are severely restricted.[14-15] Owing to either growth and processing difficulties, or long-term stability of the devices, only a few alternative compounds, mainly metal halides, such as α-HgI₂, TlBr, PbI₂, have been developed. These halides primarily suffer from their weak mechanical properties and detector polarization problems.[16-18]

SUMMARY

Methods and devices for detecting incident radiation, including gamma radiation, X-ray radiation, alpha-particles, and/or nuclear radiation using single-crystalline mercury chalcohalides, such as mercury chalcoiodides, are provided. Methods of making single-crystalline mercury chalcohalides via chemical vapor transport using organic polymer vapor transport agents and single-crystals of mercury chalcohalides made using the methods are also provided.

One embodiment of a method for detecting incident radiation, includes: exposing a material comprising a single-crystal of an inorganic compound having the formula $Hg_3Q_2I_2$, where Q represents a chalcogen atom or a combination of chalcogen atoms, to incident X-ray, gamma-ray, or nuclear radiation, wherein the material absorbs the incident radiation and electron-hole pairs are generated in the material; and measuring at least one of the energy or intensity of the absorbed incident radiation by detecting the generated electrons, holes, or both.

One embodiment of a device for the detection of incident radiation includes: a material comprising a single-crystal of an inorganic compound having the formula $Hg_3Q_2I_2$, where Q represents a chalcogen atom or a combination of chalcogen atoms; a first electrode in electrical communication with the material; a second electrode in electrical communication with the material, wherein the first and second electrodes are configured to apply an electric field across the material; and a detector configured to measure a signal generated by electron-hole pairs that are formed when the material is exposed to incident radiation.

One embodiment of a method of making a single-crystal of an inorganic compound having the formula $Hg_3Q_2I_2$, where Q represents a chalcogen atom or a combination of chalcogen atoms, includes growing the single-crystal via chemical vapor transport growth in the presence of an organic polymer vapor transport agent.

Embodiments of single-crystals of $Hg_3Q_2X_2$ that can be grown using chemical vapor transport in the presence of an organic polymer vapor transport agent have lengths of at least 5 mm and thicknesses of at least 1 mm.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 3A depicts a single-crystalline wafer of $Hg_3S_2I_2$ grown through a vapor transport method. FIG. 3B depicts single-crystalline wafers of $Hg_3Se_2I_2$ grown through a vapor transport method. FIG. 3C depicts single-crystalline wafers of $Hg_3Te_2I_2$ grown through a vapor transport method. The scale bars correspond to 5 mm. FIG. 3D depicts the electronic absorption spectrum obtained from diffuse reflectance measurement on ground $Hg_3Q_2I_2$ crystals.

(FIGS. 4B, 4C and 4F) also show terraces on the surface. The indices of crystallographic planes of the as-grown surface were determined by XRD for $Hg_3Se_2I_2$ and $Hg_3Te_2I_2$ in FIG. 4G. The lattice planes of (0 m 0) in $Hg_3Se_2I_2$ and (n n 0) in $Hg_3Te_2I_2$ are shown in FIGS. 4D and 4H.

FIG. 11A shows I-V characteristics in the dark (solid circles) and under laser excitation (hollow circles) for $Hg_3S_2I_2$ FIG. 11B shows I-V characteristics in the dark (solid circles) and under laser excitation (hollow circles) for $Hg_3Se_2I_2$ FIG. 11C shows I-V characteristics in the dark (solid circles) and under laser excitation (hollow circles) for and $Hg_3Te_2I_2$.

FIG. 17A shows the dark current and photocurrent under ambient light with the intensity of 0.1~0.2 mW/cm². FIG. 17B shows the ON/OFF behavior of the device under ambient light. The rise time and fall time are largely determined by the mechanical switch time interval.

FIG. 19A shows the cathode under irradiation. FIG. 19B shows the anode under irradiation. FIG. 19C indicates the time-dependent spectrum over 240 s of the device under 200 V. FIG. 19D shows spectra obtained from the champion device operated at 450 V for 120 s.

DETAILED DESCRIPTION

Figure 1:
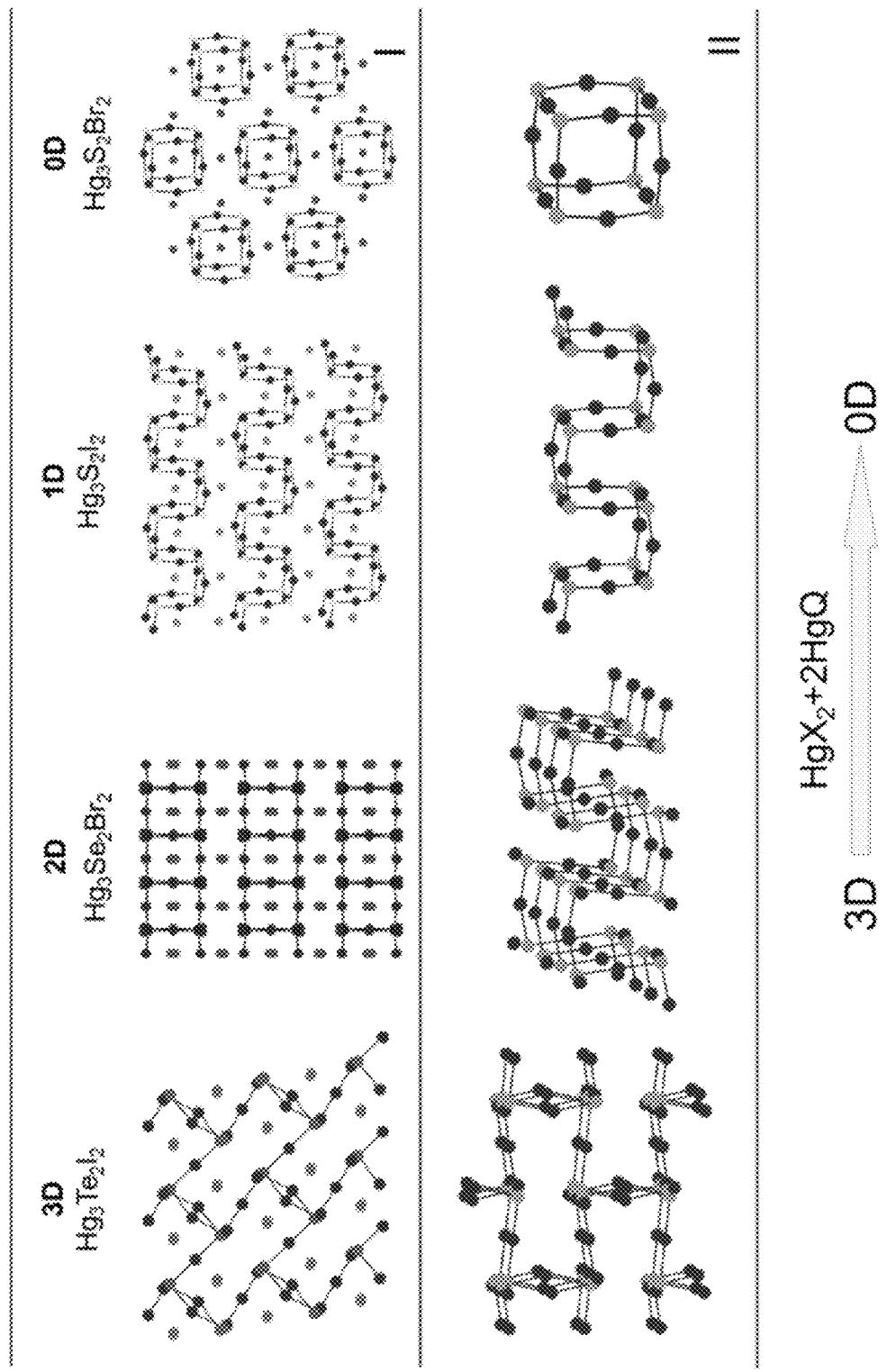
FIG. 1 depicts the diversity of the crystal structure of $Hg_3Q_2X_2$ (Q=S, Se, Te; X=Cl, Br, I) compounds and schematic dimensional reduction (DR) of the Hg-Q frameworks through lattice hybridization (LH). The crystal structures shown are all stable at ambient conditions. Row I shows representative crystal structures varying from 3D to 0D, Row II illustrates the dimensional reduction of Hg-Q frameworks in this system. This system includes: $Hg_3Q_2Cl_2$ (Q=S, Se, Te), and $Hg_3Te_2X_2$ (X=Br, I) 3D structure, $Hg_3Se_2Br_2$ 2D layered monoclinic structure, an $Hg_3Q_2I_2$ (Q=S, Se) 1D orthorhombic structure that contains Hg-Q ribbons along an a axis, and an $Hg_3S_2Br_2$ 0D monoclinic structure.

Methods and devices for detecting incident radiation, such as incident X-rays, gamma-rays, and neutrons are provided. The methods and devices use mercury chalcohalide compounds having the formula $Hg_3Q_2X_2$, where Q represents a chalcogen atom or a combination of chalcogen atoms (e.g., a combination of S, Se, and Te), and X represents a halogen atom or a combination of halogen atoms (e.g., a combination of I, Br, and Cl), as photoelectric materials.

Crystalline, detector-grade materials comprising the compounds can be grown with high chemical purity and high crystal quality. Methods of making detector-grade materials include, for example, melt Bridgman growth, solution growth, and vapor transport growth. The growth may be carried out, for example, in evacuated sealed tubes or in an open system, vertically and/or horizontally under a gradient temperature field. The Example illustrates the vapor transport growth of large single-crystals of $Hg_3Se_2I_2$, $Hg_3S_2I_2$, and $Hg_3Te_2I_2$. The vapor transport methods described in the Example can be adapted to make other detector-grade mercury chalcohalides by employing other known mercury chalcogenide and mercury halide precursors under the same or similar reaction conditions. Although the example uses binary precursors (e.g., HgQ and $HgX_2$), the compounds can also be synthesized from elementary elements (i.e., Hg, Q, and $X_2$). Other known methods for making crystalline mercury chalcohalides can also be used, including those described in Wibowo et al., Cryst. Growth Des., 2016, 16(5), pp. 2678-2684; and Li et al., Cryst. Growth Des., 2016, 16, pp. 6446-6453, the entire disclosures of which are incorporated herein by reference for all purposes.

The vapor transport processes illustrated in the Examples can be carried out using different temperature profiles for different compounds, typically with a temperature at hot zone in the range from 5° C. to 200° C. higher than that of the cold zone according to the actual transport distance. The transport process can be done in evacuated sealed tubes or in an open system, both vertically and horizontally. Additional transport agents can be added to improve the transport efficiency. However, additional transport agents can also be excluded. Carbon coated tubes may also be used to reduce the possible contamination from the crucibles. As discussed in greater detail below and illustrated in Example 2, chemical vapor transport growth using external organic polymers as vapor transport agents is particularly well-suited for the growth of single-crystals of mercury chalcohalides having large crystal dimensions and high crystal quality.

A melt Bridgman growth also can be employed to grow large single crystals of the $Hg_3Q_2X_2$ compounds. The Bridgman growth can use, for example, an overheating temperature that is typically 10° C. to 100° C. higher than the solidification point of the compound being synthesized. During crystal growth, a temperature gradient and in-situ annealing can be used to optimize the crystal properties. Carbon coated tubes may also be used to reduce the possible contamination from the crucibles. Crystal growth may be done, for example, in a quartz tube, with or without a carbon-coating. The growth can be carried out from either the slightly HgQ-rich or the $HgX_2$-rich side, which is off the exact stoichiometry ratio, to modify the defects status.

The solution growth method involves the precipitation and nucleation of the ternary compounds from solutions of binary precursors (e.g., HgQ and $HgX_2$) at temperatures lower than their melting point temperatures. The ratio between the HgQ and $HgX_2$ precursors may vary, for example, from 2 to >0. The growth translation speed should be low enough to ensure mass transport during the crystal growth. Both Bridgman growth and solution growth can be carried out in the direction of gravity or perpendicular to the direction of gravity, or any angle between them. Additionally, both of these methods can apply the crystal selection tip or seeds in order to improve the yield of the single crystal.

Optionally, once crystals of the mercury chalcohalides have been synthesized, they can undergo surface processing, such as mechanical polishing and/or chemical etching, to obtain smooth and defect free surfaces.

Embodiments of the mercury chalcohalides have a band gap of at least 1.5 eV. This includes compounds having a band gap of at least 1.8 eV and further includes compounds having a bandgap of at least 2.1 eV. For example, in some embodiments the compounds have a band gap in the range from about 1.6 eV to about 3 eV. Methods of determining the bandgap of a material are described in the Example.

The mercury chalcohalides have high electrical resistivities. For example, some embodiments of the mercury chalcohalides have an electrical resistivity at 23° C. of at least $10^{10}$ Ω·cm. This includes mercury chalcohalides having an electrical resistivity at 23° C. of at least $10^{11}$ Ω·cm, and further includes mercury chalcohalides having an electrical resistivity at 23° C. of at least $10^{12}$ Ω·cm. Methods of determining the electrical resistivity of a material are described in the Example.

Crystals of the mercury chalcohalides can have high densities. For example, some embodiments of the mercury chalcohalides have a density of at least 7 g/cm. This includes embodiments having a density of at least 7.3 g/cm, and further includes embodiments having a density of at least 7.5 g/cm.

One aspect of the invention provides devices for the detection of incident radiation. In some embodiments, the devices comprise: a material comprising a mercury chalcohalide, of one or more of the types described herein, wherein the material is capable of absorbing incident radiation and generating electron-hole pairs; a first electrode in electrical communication with the material; and a second electrode in electrical communication with the material. In such devices the first and second electrodes are configured to apply an electric field across the material. The electrodes can comprise, for example, C, Au, Pt, Pd, In, Ni, and Ti, or a combination of two or more thereof. Suitable electrodes include, but are not limited to, planar symmetrical type electrodes and planar unsymmetrical type electrodes.

The devices can further comprise one or more additional electronic components configured to measure a signal generated by the electron-hole pairs that form upon exposure of the material to the incident radiation. The incident radiation can comprise wavelengths in the visible region of the electromagnetic spectrum (i.e., wavelengths in the range from about 400 nm to about 700 nm), in the ultraviolet region of the electromagnetic spectrum (i.e., wavelengths in the range from about 10 nm to about 400 nm), in the gamma region of the electromagnetic spectrum (i.e., wavelengths in the range from about $1 \times 10^{-10}$ to about $2 \times 10^{-13}$ meters), in the X-ray region of the electromagnetic spectrum (i.e., wavelengths in the range from about 0.01 to 10 nanometers), and in two or more of these regions.

In addition, the mercury chalcohalides can be used for thermal neutron detection via the utilization of the character of $^{199}$Hg(n, γ) reaction to detect thermal neutrons. (See, Chen, H., et al. In *Novel semiconductor radiation detector based on mercurous halides*, 2015; pp 95930G-95930G-11.) Because $^{199}$Hg comprises 16.9% of natural mercury, and has a capture cross section of 2200b. (See, Beyerle, A. G., et al., Neutron detection with mercuric iodide detectors. *Nuclear Instruments and Methods in Physics Research Section A: Accelerators, Spectrometers, Detectors and Associated Equipment* 1987, 256 (2), 377-380 and Bell, Z. W., et al. Neutron detection with cryogenics and semiconductors. *physica status solidi (c)* 2005, 2 (5), 1592-1605.) With the addition of an external absorber such as $^{10}$B onto the detector, those detectors can be applied for the detection of thermal neutrons.

Unless otherwise indicated herein, the values for measured or measureable quantities refer to the value of those quantities at room temperature (~23° C.) and pressure (~1 atm).

One aspect of the inventions described herein is based on the inventors' discovery that large, high-quality single crystals of the mercury chalcohalides can be grown using an organic polymer as a transport agent, along with an appropriate temperature profile, during the chemical vapor transport (CVT) growth of the crystals. This is illustrated in Example 2, which describes the CVT growth of single-crystalline $Hg_3Se_2I_2$ using the organic polymer polyethylene as a vapor transport agent. CVT growth is based on heterogeneous reactions in which a condensed phase, generally a solid, has an insufficient pressure for its own volatilization, but can be volatilized in the presence of a gaseous reactant, the transport agent, and then deposited in the form of a crystal. The role of transport agents is to suppress nucleation centers during vapor transport in favor of obtaining large single platelets or polyhedrons of $Hg_3Q_2X_2$ crystals. Transport agents include auto transport agents and external transport agents. Auto transport agents are formed by the incongruent thermal decomposition of the solid and the substance is transferred into the gas phase at a high temperature. The use of transport agents is known; however, transport agents play a complex role on the stoichiometric ratio of crystals grown from CVT and can have an unpredictable effect on crystal growth. For example, transport agents can modify the point defects status and, thus, the physical and transport properties of the crystals, also their shapes and dimensions.

Although the use of organic polymers as transport agents is illustrated using polyethylene in Example 2, other organic polymers can be used. Because vapor transport improvement may be achieved by enhancing the transport efficiency of the chalcogenide, which can be achieved by the decomposition of an organic polymer to form hydrogen, which reacts to form volatile species, such as $H_2Q$, other polymers that can dissociate to form hydrogen and/or gaseous hydrogen-chalcogenide gaseous species can be used as transport agents. These include other polyolefins, such as, but not limited to C3-C6 polyolefins, including polypropylene and polybutylene.

The use of organic polymers as transport agents for the growth of mercury chalcohalides enables the growth of single-crystals of the mercury chalcohalides having dimensions, including lengths, widths, and thicknesses that render them well suited for use in radiation detectors. By way of illustrate, single-crystals of $Hg_3Q_2X_2$ compounds can be grown with thicknesses that are large enough to allow for the absorption of at least 80% of the incident radiation. Some embodiments of the single-crystals have at least one lateral dimension (i.e., length or width) of at least 5 mm. This includes single-crystals having at least one lateral dimension of at least 7 mm and further includes single-crystals having at least one lateral dimension of at least 1 cm. By adding an organic polymer transport agent, crystals having long lengths and large widths can be grown. These low aspect ratio (i.e., length/width), plate-like crystals differ from more elongated, needle-like crystals, which have high aspect ratios. By way of illustration, using CVT growth with an organic polymer transport agent, mercury chalcohalides having aspect ratio of 5 or lower. This includes single-crystals having aspect ratios of 3 or lower, further includes single-crystals having aspect ratios of 2 or lower, and still further includes single-crystals having aspect ratios of 1.5 or lower.

Some embodiments of the single-crystals, including single-crystals having low aspect ratios and long lengths, have a thickness of at least 0.5 mm. This includes embodiments of the single-crystals having a thickness of at least 1 mm, further includes embodiments of the single-crystals having a thickness of at least 2 mm, and still further includes embodiments of the single-crystals having a thickness of at least 3 mm. For the purpose of measuring the dimensions of a single-crystal, the length can be determined by the longest lateral dimension of the crystal and the width can be determined by the longest lateral dimension running perpendicular to the length dimension. The thickness of the crystal is the transverse dimension running orthogonal to the length and width dimensions.

In addition to enabling the growth of larger and thicker single-crystals of the $Hg_3Q_2X_2$ compounds, the addition of an organic polymer vapor transport agent to the CVD growth process improves the energy resolution of the alpha spectrum response, which reflects the improved crystal quality. The alpha response of a crystal can be measured as the full width at half maximum of the alpha particle peak in the energy spectrum, as described in Examples 1 and 2. By way of illustration, some embodiments of the mercury chalcogenide single-crystals provide an energy resolution under $^{241}$Am α particle illumination, as measured by FWHM of the energy spectrum, of 10% or less when biased at 450 V. This includes single-crystals that provide an energy resolution under $^{241}$Am α particle illumination, as measured by FWHM of the energy spectrum, of 9% or less when biased at 450 V.

EXAMPLES

Example 1

In this example, the systematic single crystal growth and properties of the $Hg_3Q_2I_2$ (Q=S, Se, Te) are reported, with emphasis on the influence of the Hg-Q framework dimensionality on the physical properties. High-quality single crystals have been grown through vapor transport method. These compounds all exhibit high resistivity (>$10^{11}$ Ω·cm), high specific density (>7 g/cm$^3$), and good transport properties. They all have high photo response under high-energy photon/α-particle radiation. Furthermore, detailed first-principles electronic structure calculations and detector performance measurements confirm their potential as materials for X- and γ-ray detection. These compounds all manifest a defect anti-perovskite structure where half of Hg atoms are missing in this system deviating from the parent hypothetical anti-perovskite formula $Hg_6Q_2X_2$. In an anti-perovskite structure, the position of the cations and anions is inverted with respect to the perovskite structure.

Experimental Section

Materials. Chemicals in this work were used as obtained: (i) Mercury metal, 99.9999%, Sigma-Aldrich; (ii) Sulfur pieces, 99.999+%, Alfa Aesar; (iii) Selenium shot, 99.999+%, Alfa Aesar; (iv) Tellurium shot, 99.999+%, Alfa Aesar; (v) Iodine lump, 99.999%, Alfa Aesar; (vi) Mercury iodide, 99.999%, Alfa Aesar.

Starting material synthesis. HgQ (Q=S, Se and Te) was synthesized using elemental mercury and corresponding Q with a stoichiometric 1:1 ratio. Owing to the high vapor pressure of elemental mercury (~15 atm) and the chalcogens at 823 K, a long quartz tube was used that extended beyond the hot zone of the furnace, providing a cold end for the elements to condense and reduce the pressure within the reaction tube. After the reaction, all the materials were transported to the cold end. Two or three cycles were completed to ensure the complete reaction of mercury metal with the chalcogens.

Vapor transport growth of single crystals. Vapor transport has been successfully applied for the growth of high-quality large single crystals of the chalcohalides $Hg_3Q_2I_2$. HgQ and α-$HgI_2$ (~2 g in total) were used as the starting materials with a molar ratio of 2:1. The detailed information for the temperature profile and vapor transport parameters is given in FIGS. 7A-7B to this disclosure, which is incorporated herein by reference. The indicated temperature parameters, including the hot and cold zone temperatures and the transport time, were explored extensively to find the ideal values for large single crystal growth.

Electrical measurement. For current-voltage (I-V) measurements, planar Au contacts with thickness of ~50 nm were deposited by e-beam evaporation through a mask onto $Hg_3Te_2I_2$ samples, while carbon paint contacts were used for $Hg_3S_2I_2$ and $Hg_3Se_2I_2$ samples. The resistivity was measured in the dark using a Keithley 6517B electrometer. The resistivity is calculated from the I-V characteristics between −10 and +10 V.

Figure 8:
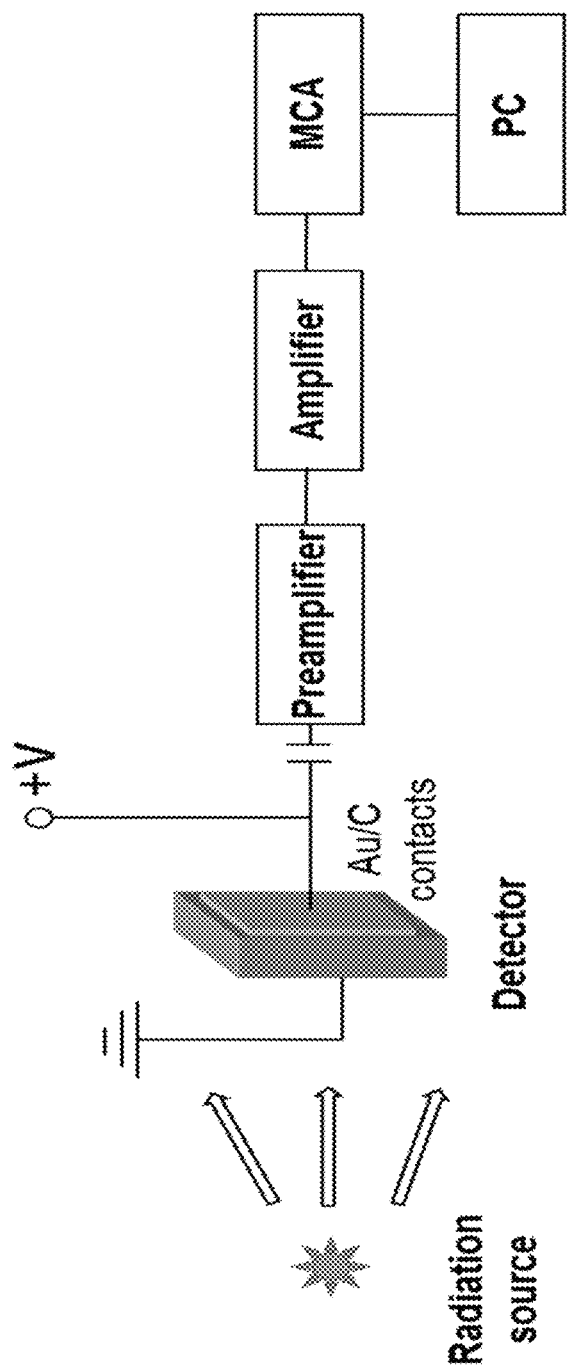
FIG. 8 depicts the detection measurement system for the as-prepared $Hg_3Q_2I_2$ devices of Example 1.

Radiation detection measurement and charge transport properties. For detector performance measurements, planar-type detectors were prepared, where the C or Au electrodes were on parallel surfaces of the crystal. Carbon electrodes were prepared by depositing colloidal graphite paint and Au contact were deposited by e-beam evaporation. The gamma ray sources employed were a non-collimated 0.3 mCi $^{57}$Co 122 KeV and $^{241}$Am 59.5 KeV γ-ray source. In each measurement, the as-prepared detectors were placed in an enclosed shielding box connected to an eV-550 preamplifier. A positive bias varying from 10 to 500 V was applied on the bottom contact while the γ-ray source was irradiated on the top cathode contact, as schemed in FIG. 8. A SPEAR detector operated at a bias voltage of 500 V and equipped with a 5×5×5 mm³ CZT crystal was used as a reference. The signals from the preamplifier were further amplified and shaped by the ORTEC amplifier (Model 572A) with a gain of 100-500 and shaping time of 1-6 µs. The final signals were subsequently evaluated by a dual 16 K input multichannel analyzer (Model ASPEC-927) and read into the MAESTRO-32 software, which generated and displayed the response spectrum. The mobility was estimated using alpha pulse height spectroscopy, which was tested by the $^{241}$Am alpha particle source with a typical kinetic energy of 5.49 MeV. Alpha particles usually have a typical characteristic decay distance of less than tens of micrometers in dense materials.[34] For the mobility evaluation, signals from the preamplifier, instead of transferring to the ORTEC amplifier, were collected by using a homemade interface based on National Instruments software, which could capture the complete transient waveforms directly from the preamplifier with a maximum time resolution of 4 ns. Each transient waveform was analyzed to determine its rise time $t_r$, which corresponded to the transit time between 10% and 90% of the amplitude of the transient pulses.

Results and Discussion

The crystal chemistry in the ternary Hg-Q-X system is very diverse. One of the most important in this system is $Hg_3Q_2X_2$ (Q=S, Se, Te; X=Cl, Br, I), which exhibits very versatile crystal structures with numerous structural types.[35-37] FIG. 1 shows various features of the crystal structures of $Hg_3Q_2X_2$ which are thermodynamically stable at room temperature. The detailed structural information is indicated in Table 1. From the perspective of sub-structure of Hg-Q motifs, they manifest zero-dimensional crystal structures to one-dimensional chain to two-dimensional sheet and finally three-dimensional network.

TABLE 1

Crystal structure and physical properties of the Hg-based chalcohalides, $Hg_3Q_2X_2$ (Q=S, Se and Te; X=Cl, Br and I)

| Compound | Crystal Structure | Density (g/cm³) | Dimensionality of Hg—Q frameworks |
|---|---|---|---|
| $Hg_3S_2Cl_2$ | $I2_13$ | 6.83 | 3D |
| $Hg_3Se_2Cl_2$ | $I2_13$ | 7.42 | 3D |
| $Hg_3Te_2Cl_2$ | $I2_13$ | 7.59 | 3D |
| $Hg_3S_2Br_2$ | C 2/m | 7.11 | 0D |
| $Hg_3Se_2Br_2$ | C 2/m | 7.57 | 2D |
| $Hg_3Te_2Br_2$ | $I2_13$ | 7.78 | 3D |
| $Hg_3S_2I_2$ | Imma | 7.04 | 1D |
| $Hg_3Se_2I_2$ | Imma | 7.38 | 1D |
| $Hg_3Te_2I_2$ | C 2/c | 7.58 | 3D |

As evident in Table 1 above and discussed in the text, the $Hg_3Q_2X_2$ materials have diverse structures ranging from zero-dimensional to three-dimensional, even though each structure is built on the same $QHg_3$ pyramidal unit. To assess the energetic stability of these structures and determine the reasons for this diversity, representative compounds for each space group were chosen for DFT calculations. $Hg_3Te_2I_2$ and $Hg_3S_2Cl_2$ are considered as prototypes for the 3D structure types C 2/c and $I2_13$, respectively. $Hg_3Se_2Br_2$ forms the C2/m space group that descends from the defective anti-perovskite lattice with a 2D Hg—X bond network, and thus represents that structure for our calculations. For the Imma space group that features the 1D Hg—X network, $Hg_3S_2I_2$ is chosen as the prototype. Finally, the 0D structure-type with a C2/m space group and isolated Hg—X units is represented by $Hg_3S_2Br_2$.

Regardless of the dimensionality of the crystal structure, $QHg_3$ pyramids predominated the structure of the $Hg_3Q_2X_2$, while the coordination geometry of the Hg was linear. In this system, the dimensionality changes were achieved by choosing the chalcogens and halide atoms. Usually, the lighter halides (such as Cl) and heavier chalcogens (such as Te) lead to more dimensions of Hg-Q frameworks, such as 3D $Hg_3Q_2Cl_2$ and 3D $Hg_3Te_2X_2$. The dimensionality of the Hg-Q frameworks was dominated by the electronegativity and radii of halides to a great extent. In $Hg_3Q_2X_2$, the coordination numbers of chalcogens and Hg atoms remained unchanged while only the Hg-Q frameworks evolved from 3D to 0D. In the $Hg_3Q_2X_2$ system, throughout the whole dimensional reduction from 3D to 0D, the high density was always retained higher than 7 g/cm³, as indicated in the Table 1.

Figure 2:
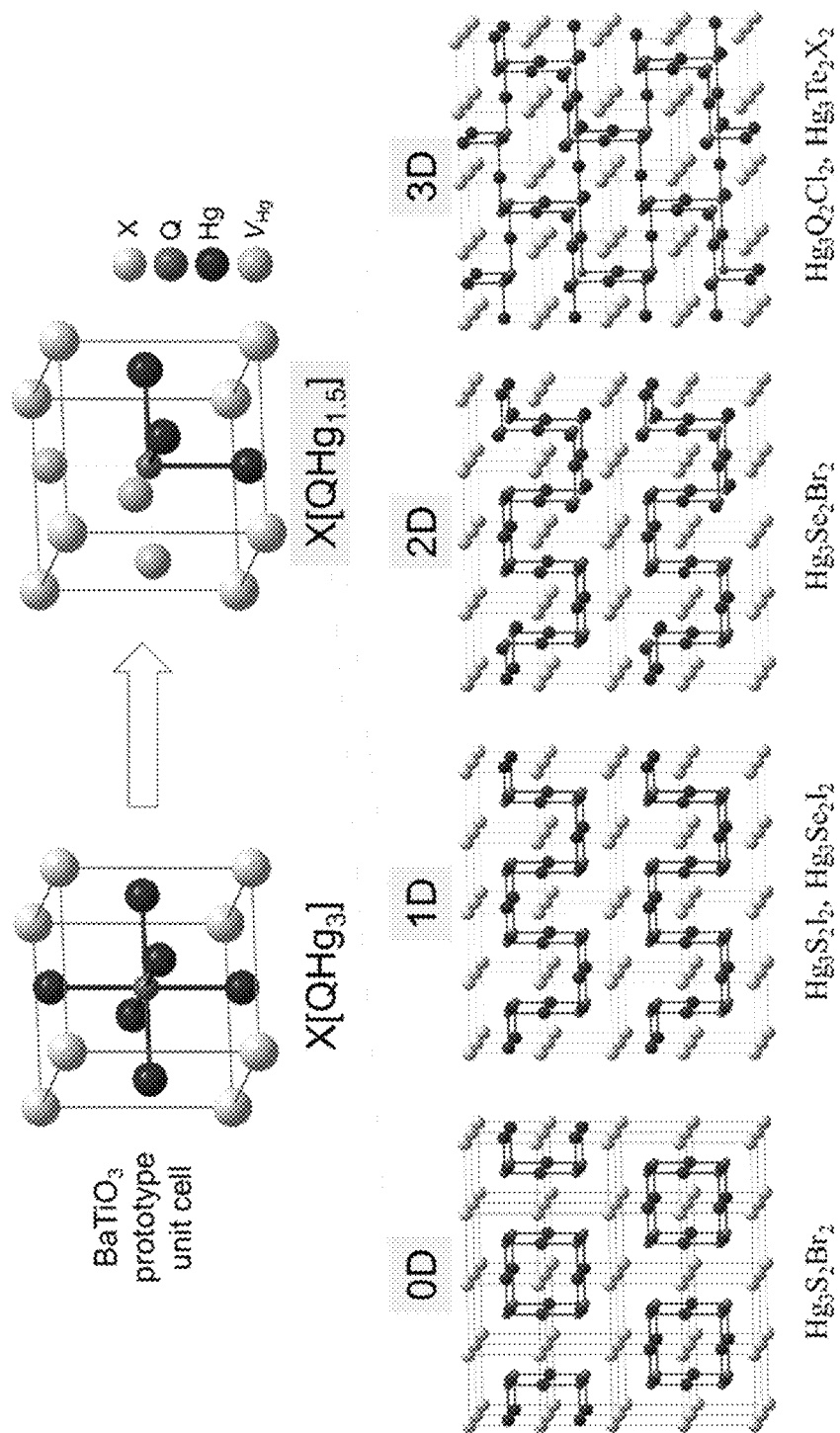
FIG. 2 depicts the structural evolution in $Hg_3Q_2X_2$ (Q=S, Se, Te; X=Cl, Br, I) based on the $BaTiO_3$-type perovskite structure. The building block $X[QHg_{1.5}]$ is modified from the unit cell of $BaTiO_3$ (P4/mmm, ICSD-27968), where three Hg atoms were removed and the Q atom is trigonal pyramidal coordinated and Hg atoms are always found on the neighboring three surfaces. Through operating the building block $X[QHg_{1.5}]$ by translation and rotation, different porotype structures with 0D-3D Hg-Q motifs can be obtained.

From another perspective, the above structures can be generally explained as deriving from the same anti-perovskite structure where half of cations are missing and ordered Hg vacancies are created (FIG. 2). The anionic bcc lattices in this system can be explained as interpenetrating primitive 'cubic' lattices of Q and X. The parent hypothetical anti-perovskite formula is $X[QHg_3]$. By doubling this formula $X_2[Q_2Hg_6]$ and removing three Hg atoms, the charge balanced $Hg_3Q_2X_2$ formula was generated. In this system, the three Hg vacancies ordered accordingly to create the different structure types (FIG. 2). There was also a similar structure found in defect perovskite $K_2Sn_2O_3$[39] and recently reported defect anti-perovskite $Fe_2SeO$[29], where half of anions and one third of cations, respectively, were also missing.

The dimensionality of the various Hg-Q motifs was achieved through removing the appropriate atoms from different locations of the perovskite unit cell (FIG. 2). The structure evolution of Hg-Q motifs played a very important role in determining the physical properties of this group of materials, as indicated in the following discussion.

The ternary phase diagrams of $Hg_3Q_2I_2$ indicated an incongruently melting behavior,[40] inhibiting crystal growth from their stoichiometric melt. Therefore, vapor transport was employed to grow single crystals, as this method is suitable for the crystal growth of complex compounds and also performs self-purification during transport.[41] Here, large single crystals of $Hg_3Q_2I_2$ were reproducibly grown through the vapor transport method (FIGS. 3A-3D).

Figure 7A:
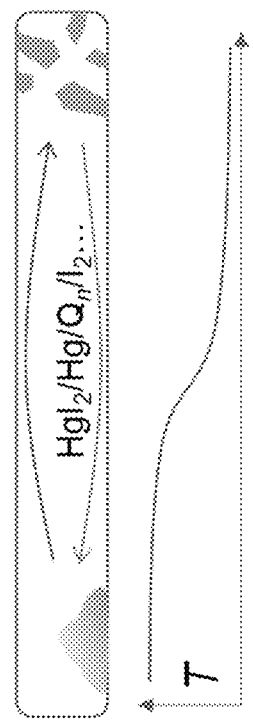
FIG. 7A is a schematic diagram that represents the vapor transport growth method for the growth of $Hg_3Q_2I_2$ (Q=S, Se and Te) single crystals.
Figure 7B:
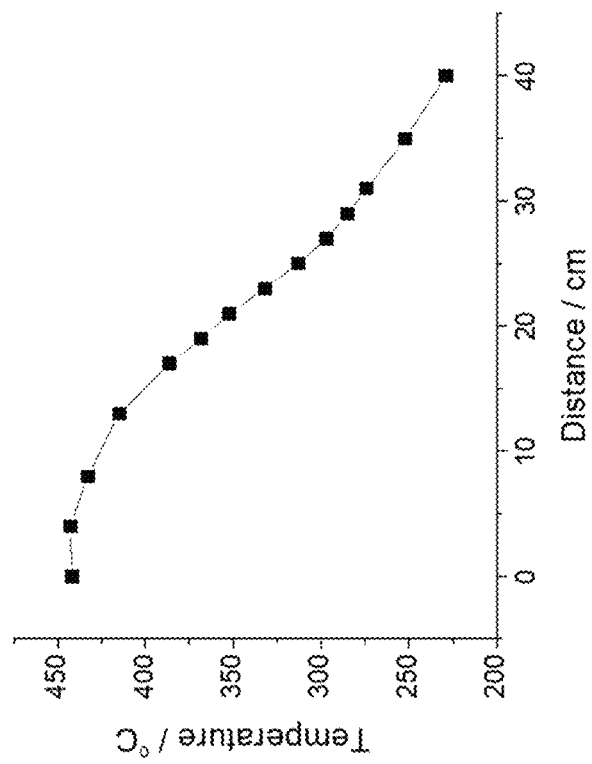
FIG. 7B shows the typical growth profile for the vapor transport growth of $Hg_3Se_2I_2$ single crystals.

A typical vapor transport system consists in a closed quartz crucible with starting materials (HgQ and $\alpha$-$HgI_2$) placed at one end as shown in FIGS. 7A-7B. The equilibrium species in the gas phase at transport temperature presumably includes Hg (g), $Q_n$ (g) and $HgI_2(g)$, $I_2(g)$ etc.[48] According to experimental partial pressure measurements of $Hg_3Te_2I_2$, the most dominant of the gaseous species present were $HgI_2$ (g) and Hg (g), and the combined partial pressures of all the other species in this system contributed less than 1% to the total pressure.[48] Thus, it is reasonable to deduce that the major limitation of the vapor transport efficiency is the lower vapor pressure of chalcogens. In addition, the effect of additional iodine ($I_2$) as the transport agent was investigated. This method was very effective for $Hg_3Te_2I_2$ with 10-100 mg excess $I_2$ during transport. By forming volatile tellurium iodides (such as TeI and $TeI_4$[48]), Te atoms were effectively transported to the cold end, where they were incorporated into the a single crystalline $Hg_3Te_2I_2$ phase.

Figures 9A, 9B, 9C:
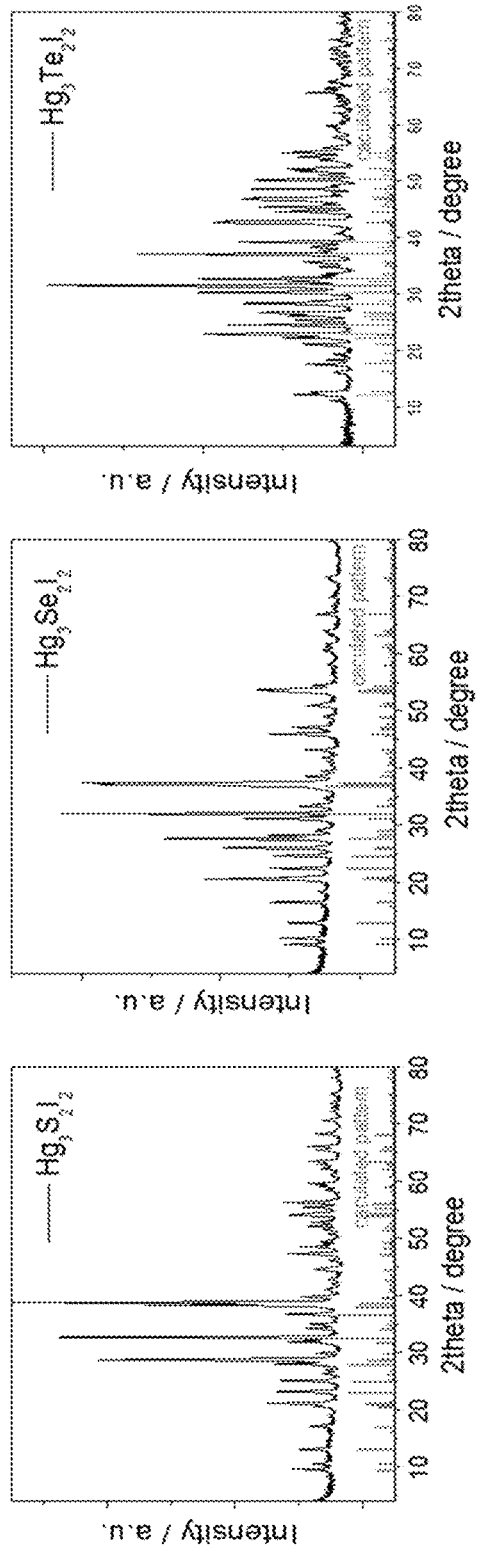
FIGS. 9A-9C show powder X-ray diffraction patterns of $Hg_3Q_2I_2$ (Q=S (FIG. 9A), Se (FIG. 9B), Te (FIG. 9C)) hybrids synthesized using the vapor transport method.

The preferred morphology of as-grown crystals for all three materials is plate-like (FIGS. 3A-3D). The single crystals of $Hg_3S_2I_2$, $Hg_3Se_2I_2$ and $Hg_3Te_2I_2$ appeared transparent yellow, bright red and gray-red colors, respectively. Under optical microscopy there was no evidence of intergrown domains, or secondary phases present. The powder X-ray diffraction (XRD) pattern in FIGS. 9A-9C showed all samples had a pure phase with no additional ternary or binary secondary phases. In particular, $Hg_3S_2I_2$ crystallized into orthorhombic structure in Imma space group, with a=9.7992(8) Å, b=18.703(3) Å and c=9.4622(7) Å.[36] $Hg_3Se_2I_2$ was isostructural with $Hg_3S_2I_2$, with a=9.7660(9) Å, b=19.381(3) Å and c=9.6332(9) Å.[36] $Hg_3Te_2I_2$ crystallized into a monoclinic crystal structure in space group C2/c, with a=14.22(4) Å, b=9.70(3) and c=14.34(2) Å, $\beta$=79.9 (2)°.[48] In addition, there was no phase transition of $Hg_3Se_2I_2$ in the temperature range of 100-573 K.[36]

The experimental bandgaps energies measured by the diffuse reflectance method for $Hg_3Q_2I_2$ crystals were 2.25 eV, 2.12 eV and 1.93 eV, respectively, decreasing from S to Te (FIG. 3D). The extension of the outermost s and p orbitals of the chalcogen atoms in the series S, Se, and Te accounted for the systematic decrease in the experimental band gap. Usually ionic compounds ($\alpha$-$HgI_2$) have larger bandgap than covalent compounds (HgQ), owing to the large difference of electronegativity of cations and anions. In the $Hg_3Q_2I_2$ system, the $[Hg_3Q_2]^{2+}$ frameworks are mainly covalent, while the bonding for Hg—X is mostly ionic. $E_g$ is usually determined by the weakest bond, Hg—X rather than Hg-Q, since it has the minimal interband separation.[49] The bandgaps of the mercury chalcogenide iodides are smaller than the bromides and chlorides, while $Hg_3Q_2X_2$ (Q=S, Se, Te; X=Cl, Br) tend to be larger than 2.50 eV.[37, 50]

Parallel strips of stepwise terraces were found near the edge of the cleaved surfaces for $Hg_3Se_2I_2$ and $Hg_3Te_2I_2$ (FIGS. 4A-4H). The as-grown $Hg_3S_2I_2$ crystal had similar features to those of $Hg_3Se_2I_2$. On the cleaved edges, the step size was about 0.1-10 μm, depending on the tilted angle of the observed plane off the preferable growth direction. Inclusions or secondary phases were not found on the as-grown surface, indicating high crystalline quality.

Figure 4B:
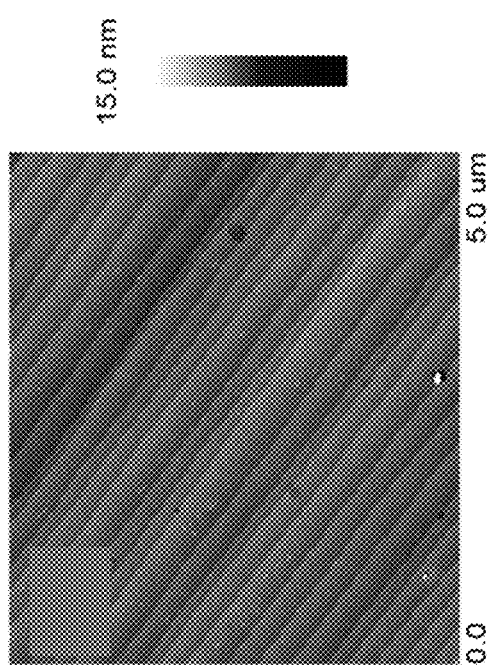
FIGS. 4A-4H depict SEM and AFM images of the surfaces of $Hg_3Se_2I_2$ crystals (FIGS. 4A-4C) and $Hg_3Te_2I_2$ crystals (FIGS. 4E-4F) showing flat steps and terrace morphology. SEM images in FIG. 4A and FIG. 4E show the feature on the cleavage surface. AFM images of the as-grown crystal surface.
Figure 4F:
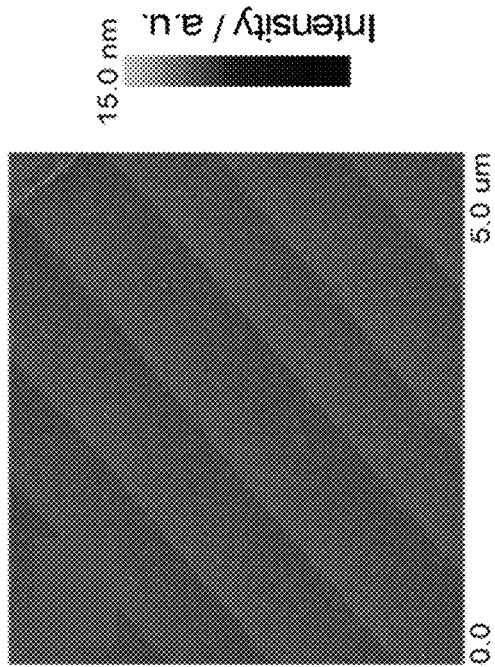
Figure 4A:
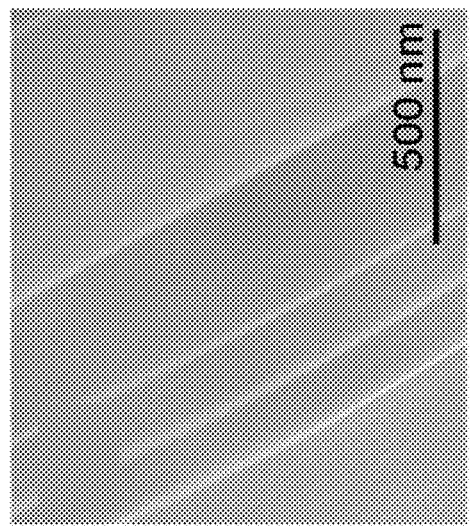
Figure 4E:
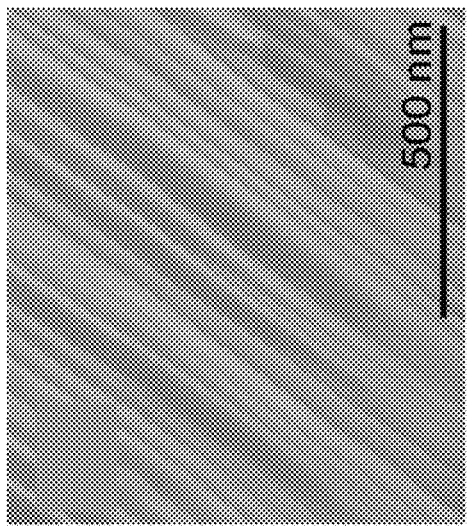
Figure 4C:
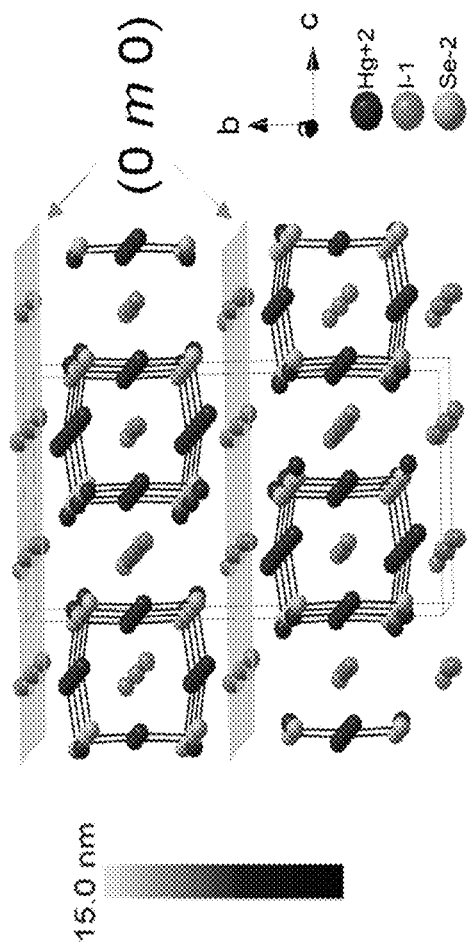
Figure 4G:
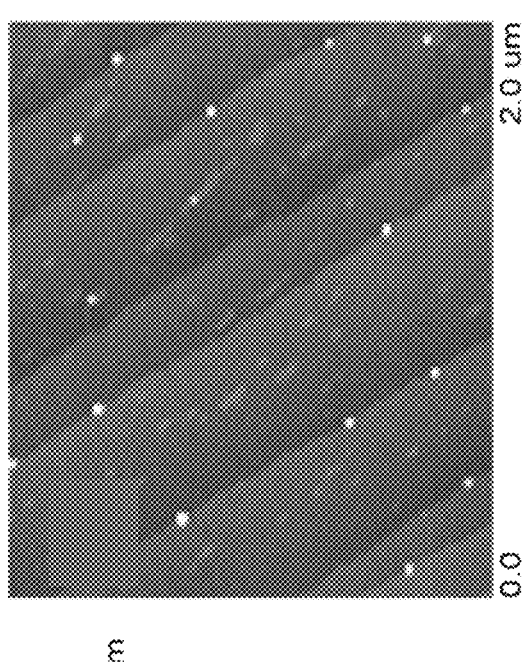
Figure 4D:
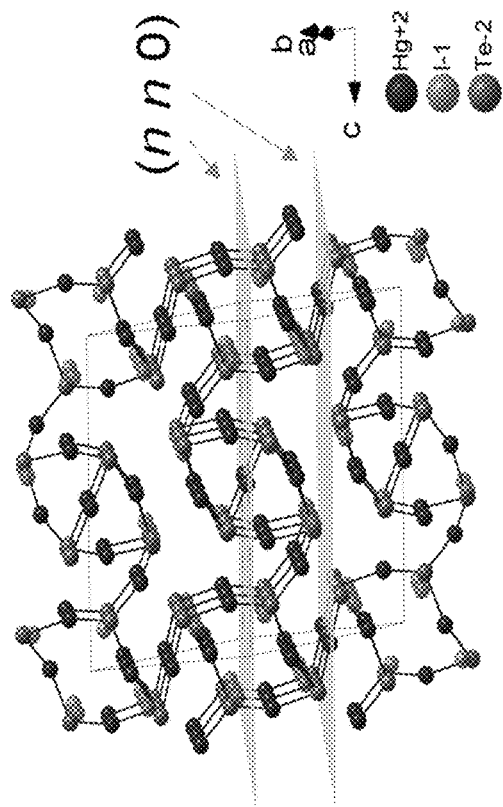
Figure 4H:
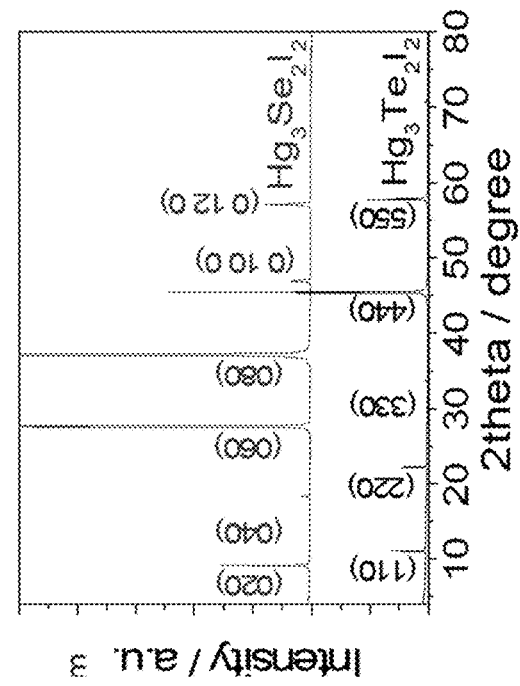

According to the atomic force microscopy (AFM) studies, the typical terrace morphology was found on all the as-grown samples with very smooth planes. The terrace step distance for $Hg_3Se_2I_2$ was 0.1-0.5 μm, and ≥1 μm for $Hg_3Te_2I_2$. XRD patterns (FIG. 4G) indicated that the surface of the as-grown $Hg_3Se_2I_2$ crystal was comprised of (0 k 0) (k=2, 4, 6 . . . ) planes. The terrace height then corresponded to the difference between $[Hg_3Se_2]$ ribbons along the b-axis, approximately half of the unit cell length along the b-axis (0.969 nm). This was confirmed by AFM as the measured terrace height for $Hg_3Se_2I_2$ was about 0.75~0.96 nm in FIG. 4C, in excellent agreement with the predicted terrace height. Owing to the strong covalent bonding character of the Hg—Se bonds, the crystals tend to grow along the direction of $[Hg_3Se_2]$ ribbons more readily (FIG. 4D). A similar terrace feature was also confirmed on the as-grown surface of the $Hg_3Te_2I_2$ samples. The index of the crystallographic plane of the as-grown surface of $Hg_3Te_2I_2$ was (h h 0) (h=1, 2, 3 . . . ), determined by the XRD pattern of the observed surface. The equilibrium shape of the crystals is usually inclined to form shapes encompassed by the low-index facets for the minimum of surface (interface) energy according to the Wulff construction.[51] The energy difference among various surfaces (interfaces) leads to the diversity of crystallographic indices of as-grown surfaces. The measured terrace height of the $Hg_3Te_2I_2$ surface was between 0.70-0.97 nm (FIG. 4F), which corresponded to the minimum spacing of ~0.968 nm in the crystal plane of (n n 0). The distance of the terraces was about 1 μm, which is much larger than that in $Hg_3Se_2I_2$ crystals.

Figures 10A, 10B, 10C:
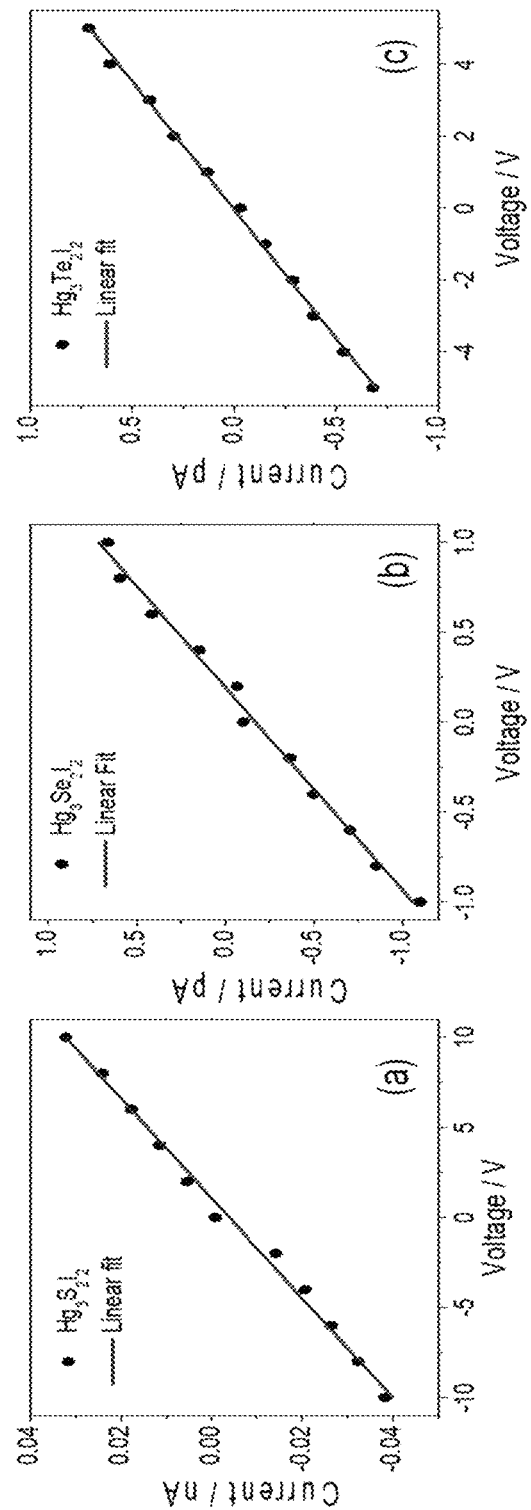
FIG. 10A depicts the voltage-current characteristic of $Hg_3S_2I_2$.
FIG. 10B depicts the voltage-current characteristic of $Hg_3Se_2I_2$.
FIG. 10C depicts the voltage-current characteristic of $Hg_3Te_2I_2$.

The as-grown crystals form platelets with smooth surfaces so they can be used for device preparation without further mechanical polishing. Here, colloidal carbon was used for preparing electrodes and as a means to connect the device to the readout electronic circuit by copper wire. The use of carbon contacts gives stable detector performance with no evidence of a chemical reaction between the electrodes and crystals, indicating good contact quality. The intrinsic resistivities of $Hg_3S_2I_2$, $Hg_3Se_2I_2$ and $Hg_3Te_2I_2$ fitted from the linear region of the I-V curve in the low bias range (FIGS. 10A-10C) were $2.0 \times 10^{11}$ Ω·cm, $1.2 \times 10^{12}$ Ω·cm and $3.5 \times 10^{12}$ Ω·cm, respectively. These values had tremendous reproducibility, as the intrinsic resistivity for these compounds among different growth runs was always at least $10^{11}$ Ω·cm regardless of various growth temperatures, starting materials and transport agents. Also, intentional doping here is not necessary to compensate the intrinsic or extrinsic ionized defects inside the single crystals. The cross-section for photoelectric absorption in a material of atomic number Z varies as $Z^n$, where $4<n<5$.[5] FIGS. 11A-11C shows the attenuation length of $Hg_3Q_2I_2$ (Q=S, Se, Te) and CdTe and $Cd_{0.9}Zn_{0.1}Te$ (CZT) calculated using the atomic attenuation coefficients as a function of incident photon energy varied from 100 KeV to 700 KeV, which is tabulated by the National Institute of Standards and Technology.[54-55] The attenuation coefficients of $Hg_3Q_2I_2$ are much higher than that of CdTe and CZT, especially in the high energy region. For instance, for $^{57}Co$ γ-rays with characterized energy of 122 KeV, the attenuation lengths are 1.70 mm for CdTe/CZT, and only 0.60 mm for $Hg_3Q_2I_2$, confirming the much higher stopping power for high energy photons. Therefore, thinner crystals can be used to absorb hard radiation with the same energy.

Detector devices of the $Hg_3Q_2I_2$ (Q=S, Se, Te) were tested for response to gamma rays using a 122 keV $^{57}Co$ source, and it was found that each compound exhibited a response to gamma ray irradiation (FIGS. 5A-5F). In the energy (pulse height) spectrum, the counts per channel were plotted as a function of the channel number, which is proportional to the pulse height from the amplifier.

Figure 5A:
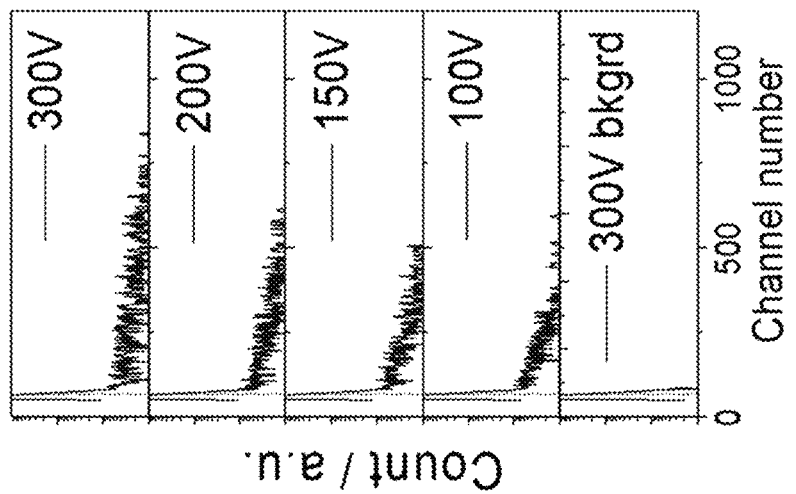
FIGS. 5A-5F depict the gamma ray response under $^{57}Co$ γ-ray source of $Hg_3S_2I_2$ (FIG. 5A) and $Hg_3Se_2I_2$ (FIG. 5B) and $Hg_3Te_2I_2$ (FIG. 5C) devices with the corresponding μτ fitting (FIG. 5D, FIG. 5E, and FIG. 5F) using the Hecht equation. The background spectra under higher voltages were also tested as the guided reference to distinguish the signals with background noise. The counting time was 200 s.
Figure 5B:
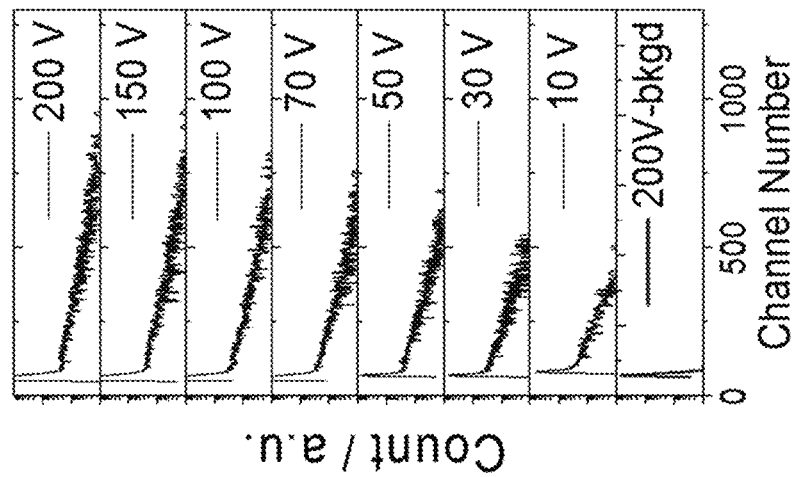
Figure 5C:
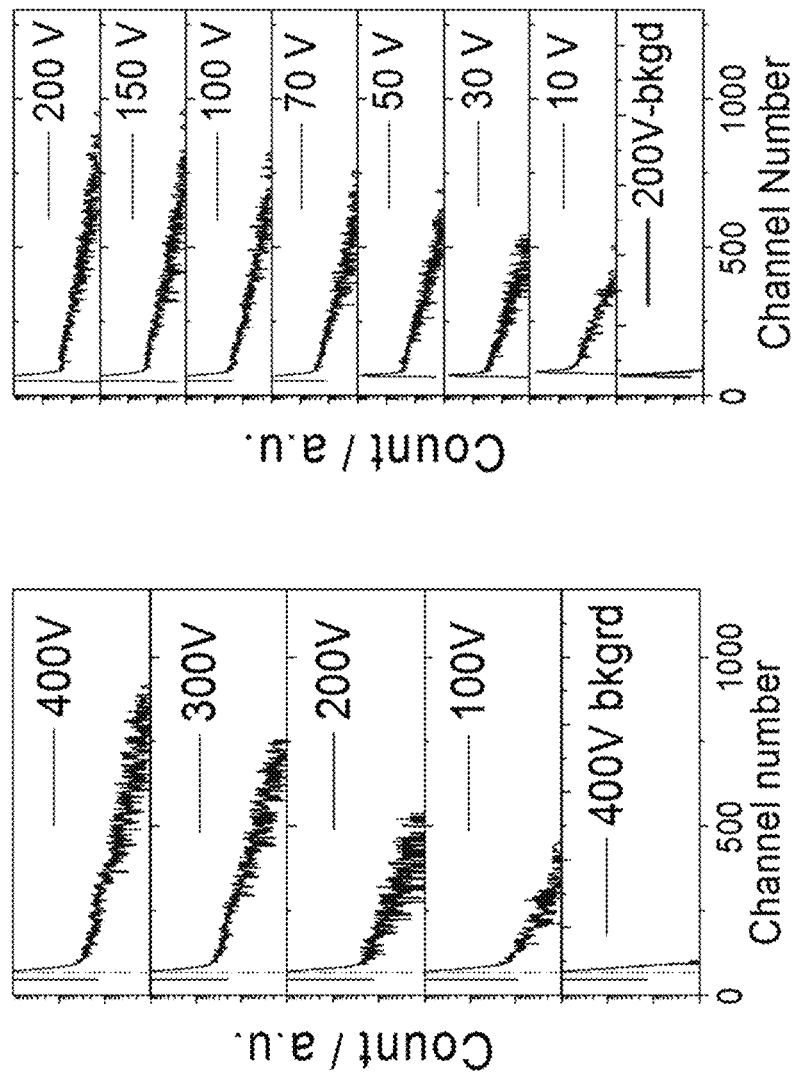
Figures 5D, 5E, 5F:
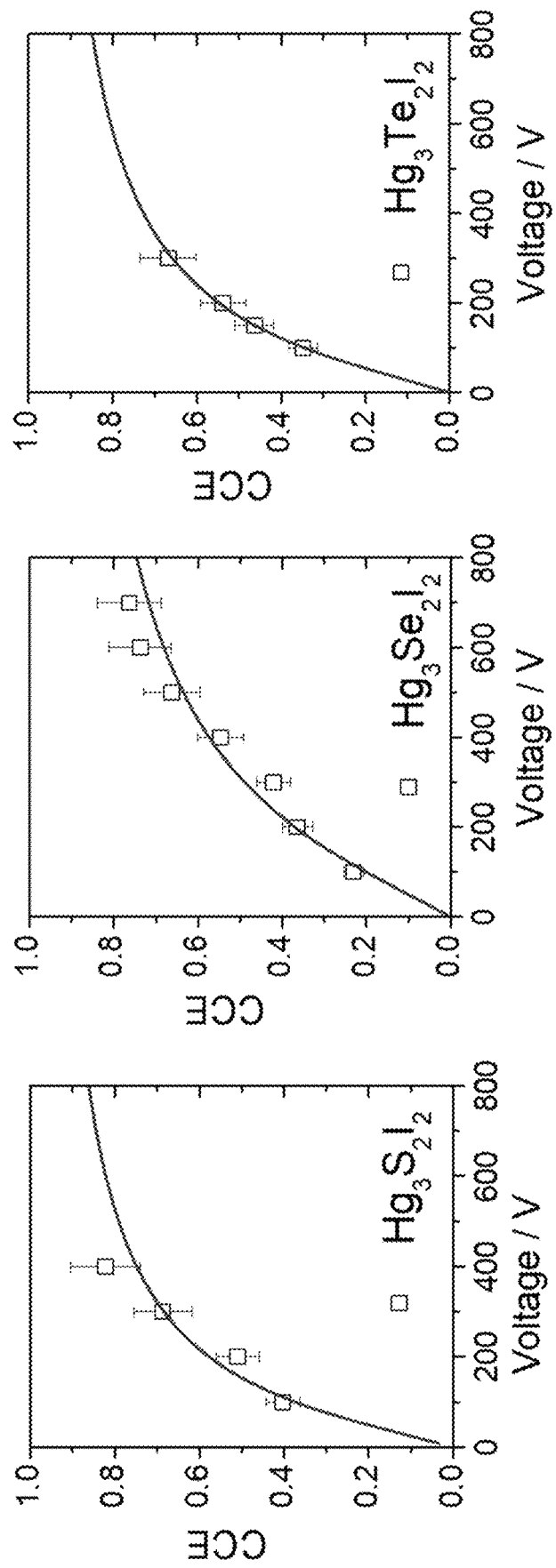

FIGS. 5A-5F show the response spectra to $^{57}Co$ gamma ray exposure measured under different biases. For the $Hg_3S_2I_2$ and $Hg_3Te_2I_2$ devices, the signals from gamma source could be clearly distinguished from the background noise, although no resolvable photo peak was observed. The charge collection efficiency (CCE) also increased with applied bias, reflected by the shift of the corresponding counts towards higher channel number. The mobility-lifetime product (μτ) of electrons was estimated by the Hecht equation (equation 1),[57] where the channel number varied as a function of applied bias, $$\eta = \frac{Q}{Q_0} = \mu\tau \frac{U}{d^2}\left(1 - e^{-\frac{d^2}{\mu\tau U}}\right) \quad (1)$$

where η is the charge collection efficiency (CCE), Q is the measured maximum channel number of photo peak/shoulder and $Q_0$ is the theoretical saturated channel number of the photo peak/shoulder, U is the applied voltage and d is the detector thickness. In the Hecht equation, a uniform electric field is assumed. The ratio of $Q/Q_0$ here is identical to the ratio of the actual charge collected by the electrodes and total charge produced by the radiation interaction.[57] The μτ products estimated from the maximum channel number according the Hecht equation (1) were $1.6\times10^{-6}$ and $3.3\times10^{-6}$ $cm^2/V$ for the $Hg_3S_2I_2$ and $Hg_3Te_2I_2$ devices, respectively. For the $Hg_3Se_2I_2$ devices, the energy spectra indicated stronger response with a high counting rate (counts per second) even under very small bias, less than 10 V (FIG. 5B). In this case, the calculated μτ product was about $1.0\times10^{-5}$ $cm^2/V$ in FIG. 5E.

Figure 12B:
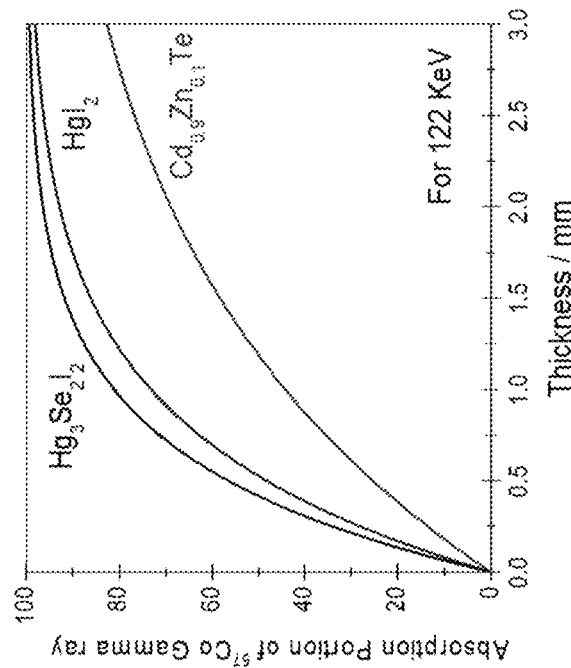
FIG. 12B shows the calculated absorption of $^{57}Co$ gamma ray with characteristic energy of 122 KeV for $Hg_3Q_2I_2$, α-$HgI_2$ and CZT.
Figure 12A:
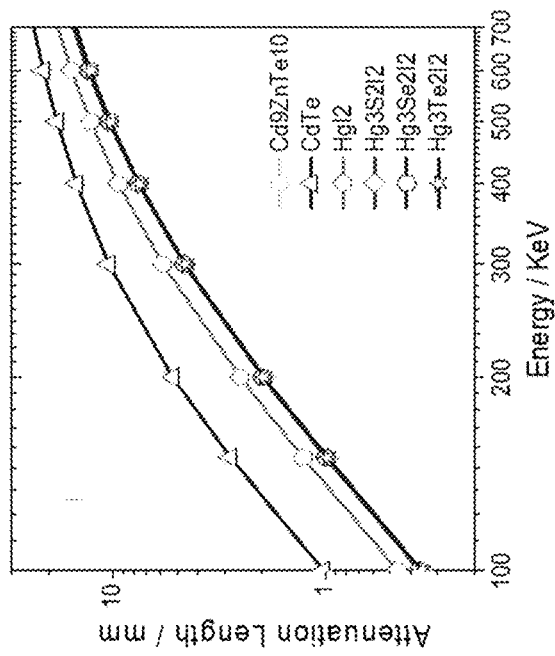
FIG. 12A depicts a comparison of the calculated attenuation length between $Hg_3Q_2I_2$ (Q=S, Se, Te), CdTe and $Cd_{0.9}Zn_{0.1}Te$ (CZT) calculated using the atomic attenuation coefficients as a function of incident photon energy. Note that the curve of $Cd_{0.9}Zn_{0.1}Te$ (CZT) is overlapped with that of CdTe.
Figure 13A:
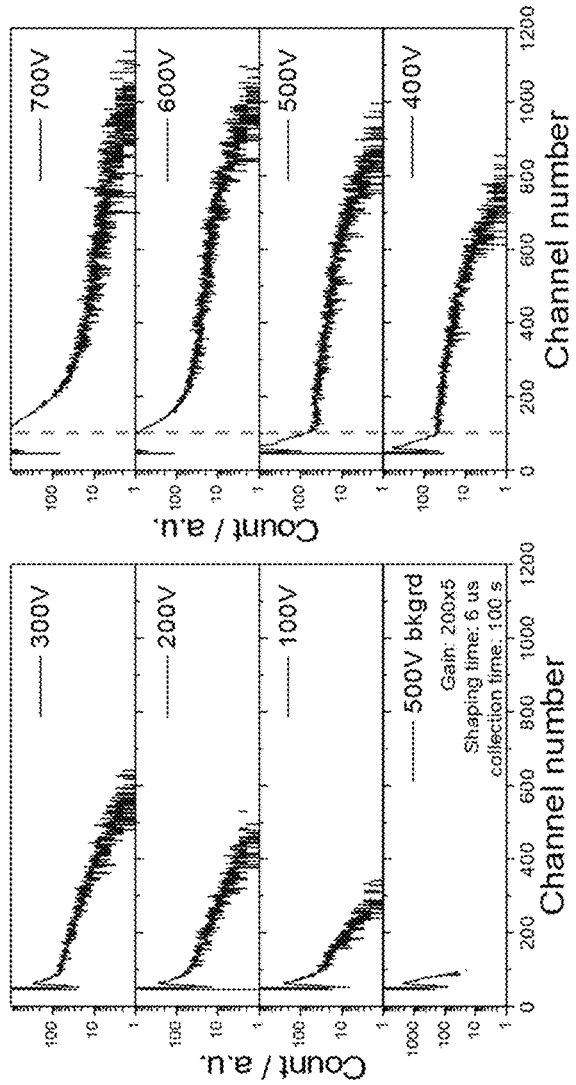
FIGS. 13A and 13B depict the gamma ray response (under 122 KeV $^{57}Co$ gamma ray source) of $Hg_3Se_2I_2$ devices with thickness of 0.5 mm. The counting time for each curve was 100 s.
Figure 13B:
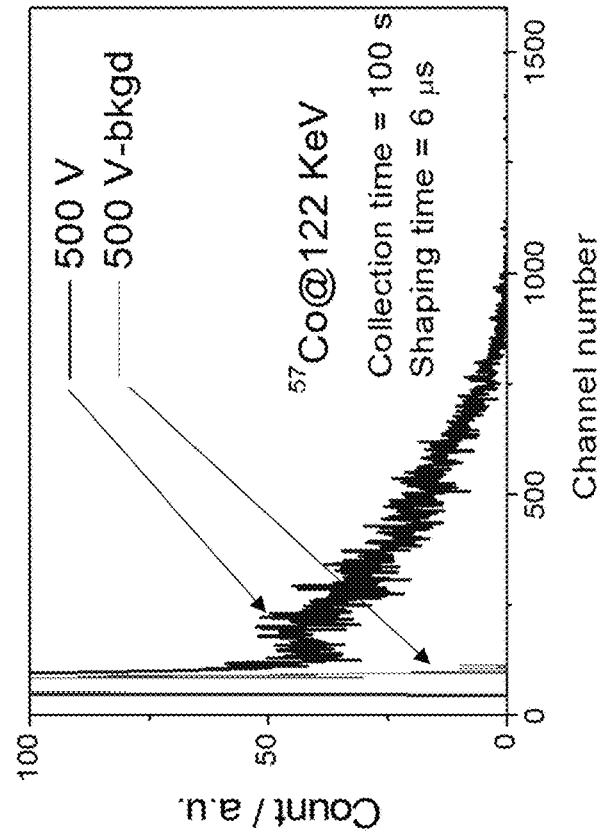

There are many possible reasons for the inability to resolving the gamma ray peaks. According to the Shockley-Ramo theorem, if the incident gamma ray interacts randomly with the detector material across the whole depth of the thickness, the induced charge (depending on the weight potential) will vary linearly from zero to its maximum value, in which no spectroscopic information can be obtained.[56, 58] For example, the low thicknesses of the $Hg_3Se_2I_2$ devices (typical thickness of 0.2 mm) limit absorption to 30% of the incident gamma rays (FIGS. 11A-11C), with the remainder passing through the device. Furthermore, this means that the penetrating gamma rays interact randomly throughout the device, causing a linearly varying induced charge which smears the energy spectrum. This can be resolved by increasing the thickness of the device or adopting single polarity charge collection methods.[59-60] As indicated in FIGS. 12A and 12B, the thickness of a thick device was 0.50 mm, which can absorb ~60% of the incident gamma ray. This device had improved resiliency and stability as the background electrical noise remained low up to 500 V, increasing dramatically over 600 V. Although the energy spectrum still showed no spectroscopic information when the bias was at 500 V (FIGS. 12A and 12B), in the linear scale the spectrum showed a very weak peak around channel number 200.

Under the $^{241}Am$ α particle source, the characteristic energy peaks for the $Hg_3Se_2I_2$ device were able to be resolved. The typical kinetic energy for incident α particles was 5.49 MeV, and all the kinetic energy immediately attenuated at the detector surface in micrometers.[61] For the single carrier measurement, the cathode was under irradiation, so that the measured signal was generated by electron drift through the thickness of the device. Spectra were collected for 2 minutes with applied voltage ranging from 10 V to 100 V (FIG. 6A). While increasing the applied bias, the spectra shifted to the higher channel number, indicating the improvement of charge collection efficiency. Meanwhile, the full width at half maximum (FWHM) in percentage decreased from >60% at 10 V to ~19% at 100 V. The calculated μτ product (FIG. 6E) was $1.0\times10^{-5}$ $cm^2/V$ using the Hecht equation with the peak channel numbers. The as-prepared device also showed the resolved peaks from 59.5 KeV $^{241}Am$ γ ray (FIG. 6C), though the FWHM (in %) was still limited, at ~50%.

Figure 6D:
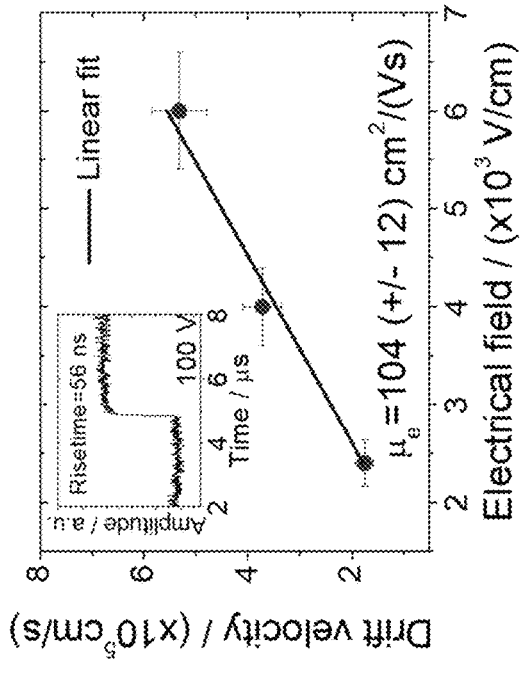
FIG. 6A depicts the alpha particle response of $Hg_3Se_2I_2$ devices with a thickness of 0.3 mm under various biases from a $^{241}Am$ α particle source with the μτ product fitting (FIG. 6E) according to the Hecht equation (1).
FIG. 6C shows the gamma ray response under $^{241}Am$ γ ray source. The counting time for each spectrum was 120 s. The histogram of rise time $t_r$ distribution (FIG. 6B) for the $Hg_3Se_2I_2$ detector under various biases. The peaks from FIG. 6B were used to estimate the mobility of electrons in the $Hg_3Se_2I_2$ detector (FIG. 6D) by linear fitting according to the equation (2). The inset is the transient pulse from one radiation event recorded by the preamplifier.
Figure 6E:
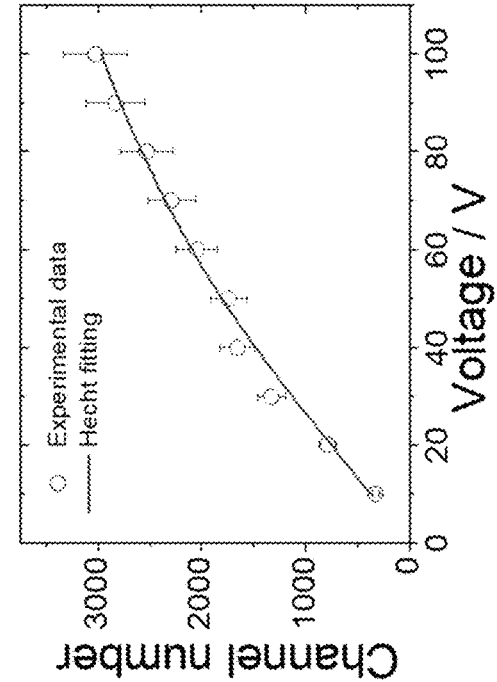
Figure 6B:
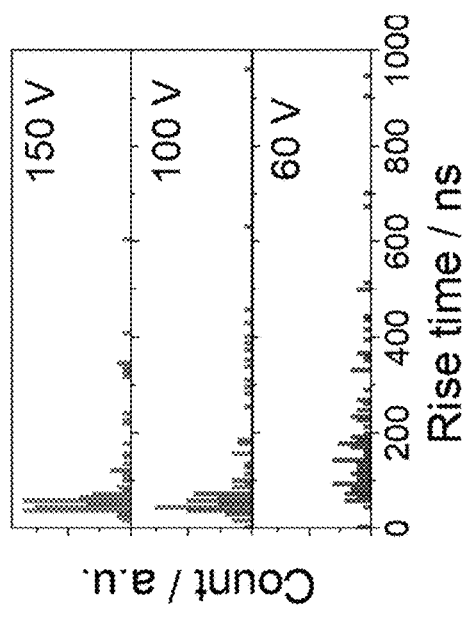
Figure 6C:
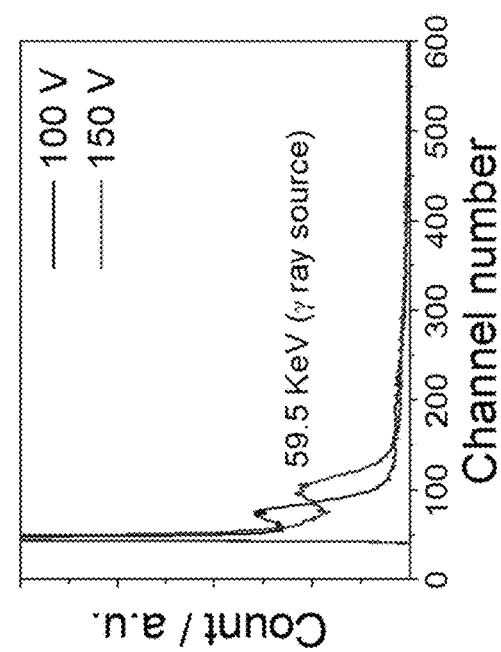

Carrier mobility is an important metric of detector performance. Carrier drift mobilities were evaluated for the samples in FIG. 6A using the rise time $t_r$ of transient waveforms from the preamplifier under $^{241}Am$ α particle source. This method is typically used for CdTe and CZT and other insulating materials to obtain mobility estimates.[62-63] For photo-generated carriers drifting across the thickness, the mobility μ is given by:

$$\mu = \frac{d^2}{U t_r} \quad (2)$$

where U is the applied bias across the thickness d, and $t_r$ is the transit time of the carriers through the device. Owing to the small penetration depth of α particles, it is assumed the transit distance approximately equals the sample thickness. For $Hg_3Se_2I_2$, the distribution of rise times $t_r$ gave a central peak and decreased with bias (FIG. 6B) due to the increasing carrier drift velocity. The calculated mobility according to equation (2) was 104±12 $cm^2/(V·s)$ (FIG. 6D). For the $Hg_3S_2I_2$ and $Hg_3Te_2I_2$, the mobility for electron was on the order of 10 $cm^2/(V·s)$, estimated from the multiple waveforms under specific bias (Table 1).

In Table 2, the various intrinsic properties of the mercury chalcohalides $Hg_3Q_2I_2$ studied here were summarized, along with those of other semiconductor detector compounds. As is clearly seen, many of the properties of the mercury chalcohalides compare favorably to the established materials. The intrinsic resistivity of the mercury chalcohalides is as high as the conventional halides, ~$10^{12}$ Ω·cm, which is beneficial due to the moderate bandgaps resulting from the lattice hybridization (LH). Such high resistivity ensures minimal of dark currents and permits a higher applied bias to achieve a higher mean free path ($\mu\tau E$) distance for photo-generated carriers. Moreover, the bandgap of $Hg_3Se_2I_2$ was smaller than $PbI_2$, $\alpha$-$HgI_2$ and $TlBr$ (Table 2), while the density was still quite high, 7.38 g/cm$^3$.

The Vickers's hardness (HV) exhibited by the $Hg_3Q_2I_2$ single crystals was two or three times higher than the conventional halides, such as $PbI_2$, $\alpha$-$HgI_2$ and $TlBr$. This confirms that the hybridization of the more covalent Hg-Q bonds leads to the lattice strengthening in $Hg_3Q_2I_2$. The robust mechanical properties greatly simplify post growth processing, including polishing, electrode preparation, and handling.

Figure 14:
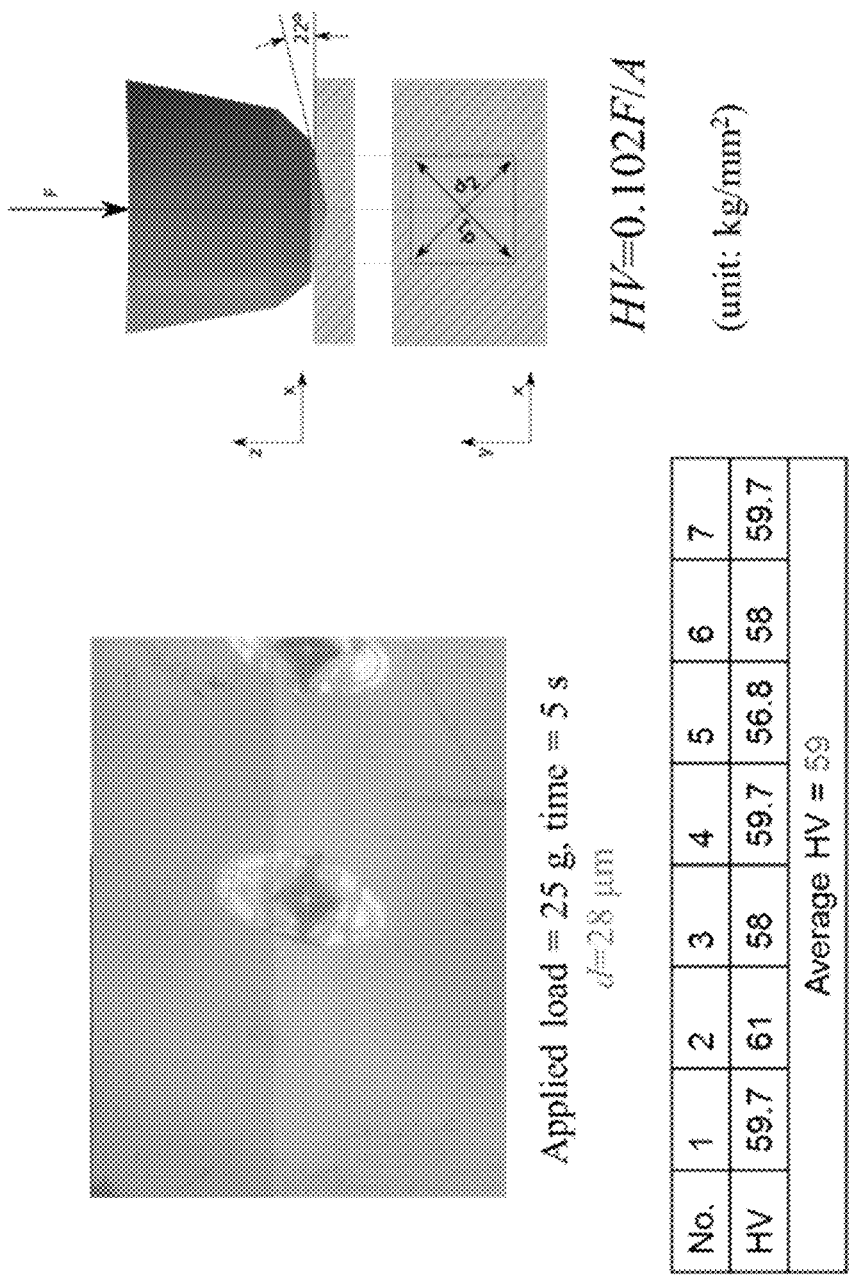
FIG. 14 depicts Vickers hardness measurement indents on a $Hg_3Se_2I_2$ crystal wafer. The left scheme is illustrated for the Vicker's hardness measurement. The right figure is one example for surface indentation after apply 25 g load for 5 s and the average diagonal distance is 28 μm. The table indicates the HV value for $Hg_3Se_2I_2$ crystal is obtained by averaging 7 different points.

FIG. 14 depicts Vickers hardness measurement indents on a $Hg_3Se_2I_2$ crystal wafer. The left scheme is illustrated for the Vicker's hardness measurement. The right figure is one example for surface indentation after apply 25 g load for 5 s and the average diagonal distance is 28 µm. The table indicated the HV value for $Hg_3Se_2I_2$ crystal is obtained by averaging 7 different points.

TABLE 5

Resistivity and photo-response of $Hg_3Q_2I_2$(Q=S, Se and Te) compounds under positive and negative applied bias.

| Compound | Laser power (mW/cm$^2$) | $\rho$ ($10^{10}\Omega \cdot$ cm) +V(−V) | $\sigma_{photo}/\sigma_{dark}$ +V(−V) | $\Delta\sigma(10^{-10}$ $\Omega^{-1}$cm$^{-1}$) +V(−V) |
|---|---|---|---|---|
| $Hg_3Te_2I_2$ | 995 | 18.18 (18.43) | 4.60 (6.80) | 0.34 (0.41) |
| $Hg_3Se_2I_2$ | 199 | 1.42 (2.0) | 46.0 (425.5) | 266.5 (232.5) |
| $Hg_3S_2I_2$ | — | 24.5 (27.1) | 43.68 (39.27) | 1.74 (1.41) |

Example 2

This example illustrates improvements to a vapor transport method by adding excess organic polymer and other transport agents to improve both the reproducibility and yield of large $Hg_3Se_2I_2$ single crystals. It indicates that the improved vapor transport growth under the assistance of organic polymer and elemental transport agent is a simple and reproducible way to grow large-size and high-quality

TABLE 2

The intrinsic properties comparison of $Hg_3Q_2I_2$ (Q = S, Se, Te) compounds with other current binary compounds studied for semiconductor detectors

| Materials | Space group | Bandgap (eV) | Density (gcm$^{-3}$) | Resistivity ($\Omega \cdot$ cm) | $\mu_e$ (cm$^2$/Vs) | HV[b] (kg/mm$^2$) |
|---|---|---|---|---|---|---|
| $\alpha$-HgS[a] | P3$_1$21 | 2.1 | 8.10 | >10$^{11}$ | <30 | ~82 |
| PbI$_2$ | P3-m1 | 2.35 [66] | 6.16 | 10$^{13}$ [4] | 8 [4] | <10 [4] |
| $\alpha$-HgI$_2$ | P4$_2$/nmc | 2.14 | 6.40 | 10$^{12}$~10$^{13}$ | 50~100 [69-70]* | 22 [71]* |
| TlBr | Pm-3m | 2.70 [57] | 7.56 | 10$^{12}$ [72] | 30 [74] | <10 [75-76] |
| $Hg_3S_2I_2$[a] | Imma | 2.25 | 7.04 | >10$^{11}$ | ~10 | 56 ± 3 [b] |
| $Hg_3Se_2I_2$[a] | Imma | 2.12 | 7.38 | >10$^{12}$ | 104 ± 12 | 59 ± 3 [b] |
| $Hg_3Te_2I_2$[a] | C 2/c | 1.93 | 7.58 | >10$^{12}$ | <10 | 71 ± 3 [b] |

* layered compound, parallel to c-axis
[a] this work
[b] The hardness for mercury chalcohalides $Hg_3Q_2I_2$ (Q = S, Se, Te) was determined by the Vickers hardness test using a diamond indenter as illustrated in FIG. 14.

TABLE 3

Detailed growth parameters for vapor transport of $Hg_3Q_2I_2$(Q = S, Se, Te) compounds

| | Starting Materials | Total Amount | Cold Zone | Hot Zone | Transport Time | Transport Distance |
|---|---|---|---|---|---|---|
| $Hg_3S_2I_2$ | 2HgS + HgI$_2$ | ~2 g | 280-300 | 380-400 | 72-120 h | 12-15 cm |
| $Hg_3Se_2I_2$ | 2HgSe + HgI$_2$ | ~2 g | 330-380 | 400-450 | 72-120 h | 12-15 cm |
| $Hg_3Te_2I_2$ | 2HgTe + HgI$_2$ | ~2 g | 400-450 | 450-530 | 72-120 h | 12-15 cm |

TABLE 4

List of structure types used to investigate the energetic stability of the $Hg_3Q_2I_2$ (Q=S, Se, and Te) compounds.

| Structure-type | Prototype compound | Space group | Dimensionality |
|---|---|---|---|
| S1 | $Hg_3Te_2I_2$ | C2/c | 3D |
| S2 | $Hg_3S_2Cl_2$ | I2$_1$3 | 3D |
| S3 | $Hg_3Se_2Br_2$ | C2/m | 2D |
| S4 | $Hg_3S_2I_2$ | Imma | 1D |
| S5 | $Hg_3S_2Br_2$ | C2/m | 0D |

$Hg_3Se_2I_2$ crystals for the application of radiation detection at room temperature. The role of transport agent is to suppress nucleation centers during vapor transport in favor of obtaining large single platelets or polyhedrons of $Hg_3Se_2I_2$ crystals. Moreover, the detector performance was also greatly improved.

Experimental Section

Materials. Chemicals in this work were used as obtained: (i) Mercury metal, 99.9999%, Sigma-Aldrich; (ii) Selenium shot, 99.999+%, Alfa Aesar; (iii) Iodine lump, 99.999%, Alfa Aesar; (vi) Polyethylene (PE), average M$_w$~4,000 by GPC. Caution: Hg metal and its related compound is highly toxic and great care should be taken with proper protective equipment in both synthesis and handling.

Vapor transport growth of $Hg_3Se_2I_2$. The high purity elements were used to synthesize the starting materials (α-HgI$_2$ and HgSe) through the vapor transport method. Specifically, the synthesis temperatures for HgI$_2$ and HgSe are 250 and 550° C., respectively. The synthesis method is similar to that described in Example 1.

For vapor transport, HgQ and α-HgI$_2$ were used as the starting materials with a mole ratio of 2:1. Generally the materials can be transferred to the cold zone under a relatively large temperature range. The temperature at the source end is usually between 460° C. and 330° C., while the cold end is about 10-150° C. lower. The temperature gradient at the transport region should be around 2-20 K/cm (Table 6). The indicated temperature profile, such as elevated and cold temperature region, were explored extensively for improving single crystal growth. One of the typical temperature profiles used is given in FIG. 15. For the typical temperature profile (FIG. 15), the source and cold end temperature are 430° C. and 300° C., and the temperature gradient is 12 K/cm across the transport zone. The typical temperature profile used for vapor transport was based on lots of experiments as a rule of thumb. Organic polymer (low molecular weight polyethylene (PE), M$_w$=~4000), and elementary Hg, Se and I$_2$ or their combinations were used as the transport agents during the vapor transport. The transport agents can also be mixed with the starting materials or can be placed separately.

Figure 15:
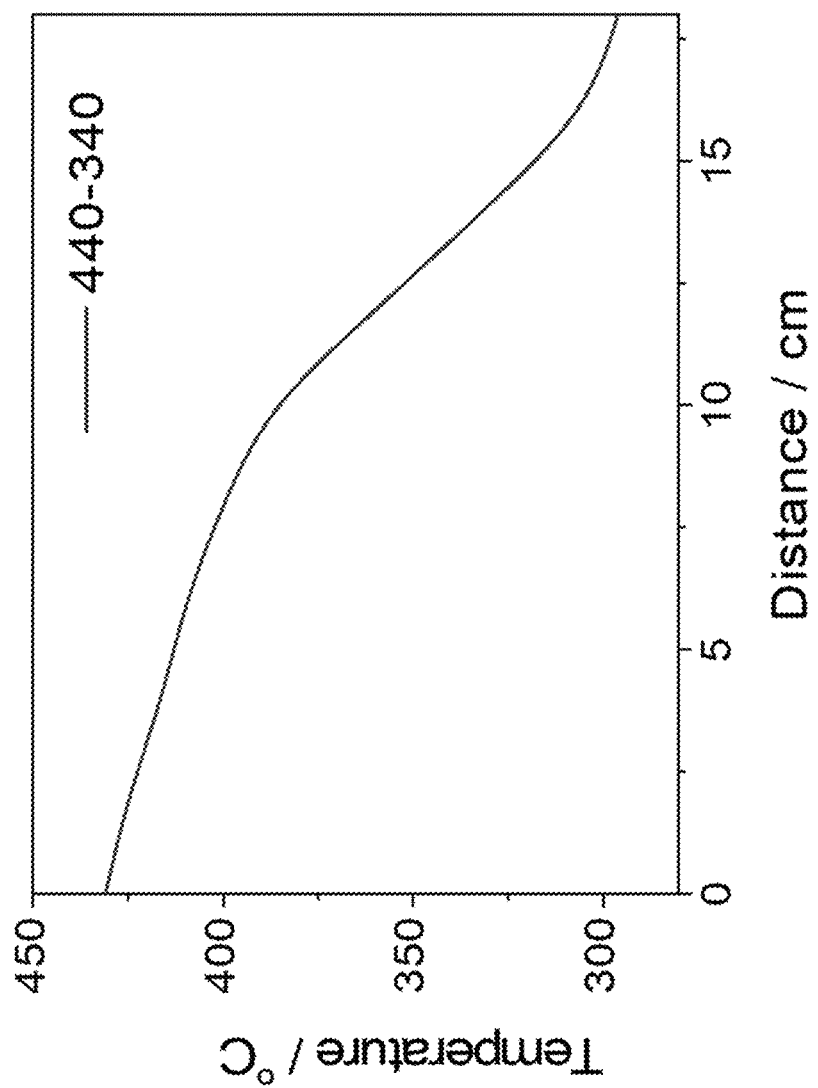
FIG. 15 depicts the optimized temperature profile used for vapor transport growth of $Hg_3Se_2I_2$.
Figure 16:
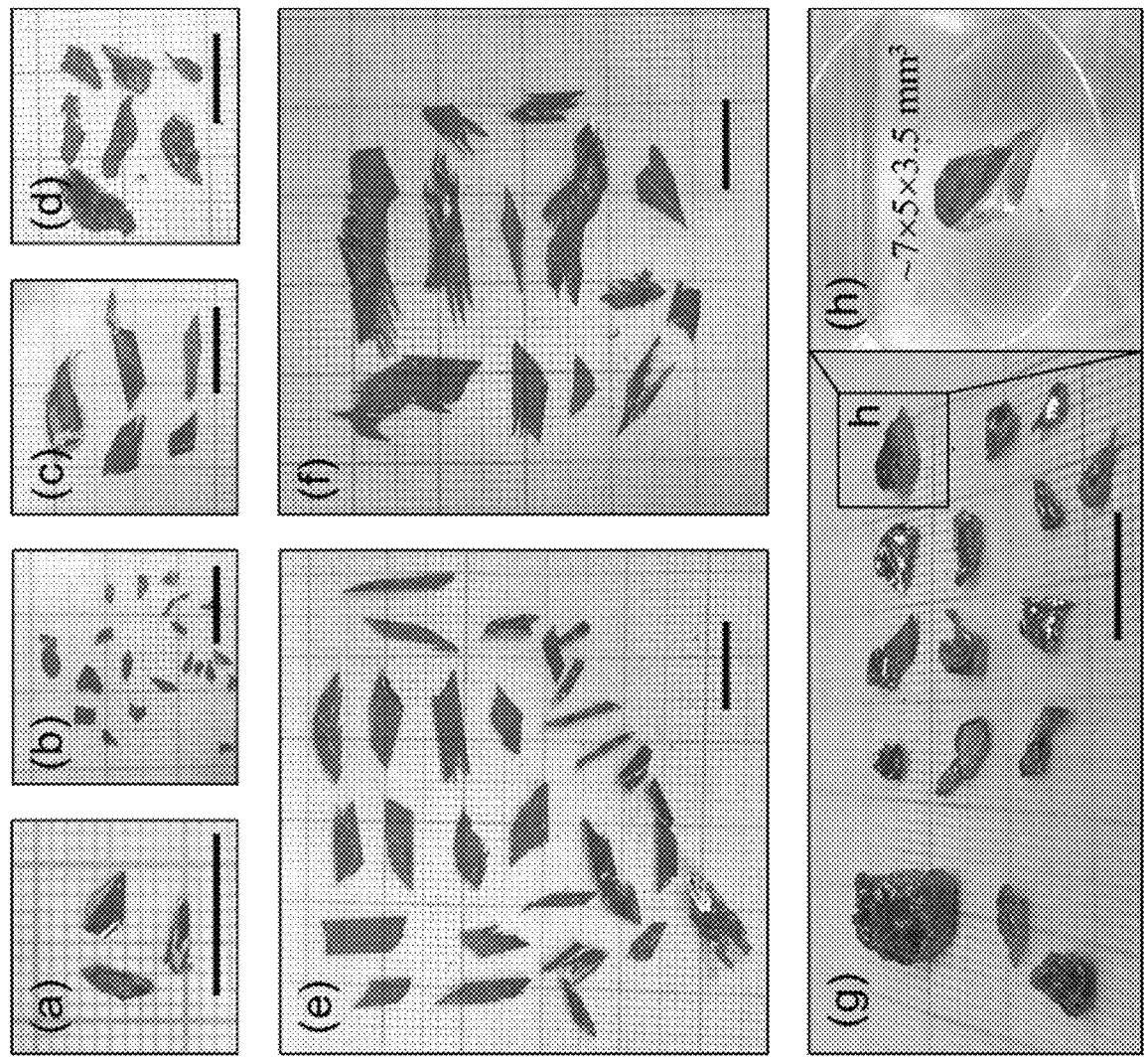
FIG. 16. Panels (a) through (h) show images showing the crystal morphology and dimensions of $Hg_3Se_2I_2$ grown under optimized temperature profile shown in FIG. 15, but with different transport agents: (a) PE excess in 2 wt. % in 13 mm tube; (b) PE excess in 1 wt. % in 13 mm tube; (c) PE excess in 0.5 wt. % in 13 mm tube; (d) $HgI_2$ excess in 10 mole % in 18 mm tube; (e) PE excess in 0.5 wt. % in 18 mm tube; (f) PE excess in 0.5 wt. % and Hg excess in 0.5 wt. % in 18 mm tube; (g) PE excess in 0.5 wt. % and iodine excess in 0.5 wt. % in 18 mm tube; and (h) single crystals obtained as indicated in (g). The scale bar indicated corresponds to 10 mm.

The range of possible vapor transport parameters used in experiments is shown in Table 6. The optimized temperature profile used for vapor transport by a two-zone horizontal furnace is indicated in FIG. 15.

TABLE 6

Possible range of vapor transport parameters used in experiments.

| Parameters | Variable Range |
|---|---|
| T$_{hot}$ | 460-350° C. |
| T$_{cold}$ | 340-250° C. |
| Temperature gradient | 2-20 K/cm |
| Transport time | >48 h |
| Transport agents | Polyethylene, I$_2$, Hg, Se |
| Tube geometry | > 10 mm (ID) |
| Starting materials | >2 g |

Electrical Properties and Detector Performance Measurements. For current-voltage (I-V) measurements, planar Au contacts with thicknesses of ~50 nm were deposited by e-beam evaporation through a shielding mask onto Hg$_3$Se$_2$I$_2$ samples. The resistivity was measured in the dark using a Keithley 6517B electrometer. The resistivity was calculated from the I-V characteristics between −10 and +10 V. Photoconductivity was evaluated under both ambient light and Ag X-ray tube (Mini-X X-Ray Tube from Amptek, Inc).

For detector performance measurements, planar-type detectors were prepared, where the Au electrodes were evaporated on parallel surfaces of the crystal. The gamma ray sources employed were a non-collimated 0.2 mCi $^{57}$Co 122 keV and 0.5 μCi $^{137}$Cs 662 keV γ-ray source. In each measurement, the as-prepared detectors were enclosed in a shielding box connected to an eV-550 preamplifier. A positive bias varying from 10 to 500 V was applied on the bottom contact, while the γ-ray source was irradiated from the top cathode contact. The signals from the preamplifier were further amplified and shaped by the ORTEC amplifier (Model 572A) with a gain of 100-500 and shaping time of 1-6 μs. The final signals were subsequently evaluated by a dual 16 K input multichannel analyzer (Model ASPEC-927) and read into the MAESTRO-32 software, which generated and displayed the response spectrum. The mobility was estimated using alpha pulse height spectroscopy, which was tested by the $^{241}$Am alpha particle source with a typical kinetic energy of 5.49 MeV. The distance between the alpha source and the surface of the detector was about 5 mm. Alpha particles usually have a typical characteristic decay distance of less than tens of micrometers in dense materials. For the mobility evaluation, signals from the preamplifier, instead of transferring to the ORTEC amplifier, were collected by using a homemade interface based on National Instruments software, which could capture the complete transient waveforms directly from the preamplifier with a maximum time resolution of 4 ns. Each transient waveform was analyzed to determine its rise time t$_r$, which corresponded to the transit time between 10% and 90% of the amplitude of the transient pulses.

Results and Discussion

Since the equilibrium partial pressures of HgI$_2$ and HgSe differ greatly, any temperature fluctuation will lead to stoichiometric imbalance and an increase in nucleation centers. Therefore, it is necessary to control the temperature at both the hot and cold zones separately and precisely. As a co-determinant, transport agents play an important role in the vapor transport process. Without using any transport agents, the as-grown single crystals tend to form needle-like shape, likely due to the quasi-1D crystal structure of Hg$_3$Se$_2$I$_2$ containing 1D Hg—Se zig-zag chains along the a-axis. Occasionally, there were some millimeter-size tabulate crystals; however, these had small thicknesses, usually around 0.1-0.2 mm. The incongruent sublimation character primarily accounts for those results. Upon heating over 420° C., Hg$_3$Se$_2$I$_2$ tends to form the HgI$_2$-rich liquid and HgSe solid through an equilibrium peritectic reaction. To ensure the nucleation of pure Hg$_3$Se$_2$I$_2$ crystals without forming an HgI$_2$-rich phase at the cold side, the pressure balance of each component, such as Hg, I$_2$, HgI$_2$ and Se during vapor transport must be controlled precisely.

By using a transport agent, this issue of incongruent sublimation has improved greatly; thus, the transport results are improved dramatically. In practice, the use of PE and an appropriate temperature profile are both essential to large single crystals growth. The amount of PE in starting materials has an effect on both the crystal size and yield. According to comparison experiments, the excess degree of PE in the starting materials varied from 2% to 0.5% in wt. %, and 0.5% excess of PE gave rise to largest monocrystalline crystals over 1 cm in size. The color appeared bright red, which corresponds well to the bandgap value, 2.12 eV. By using more transport agent (from 2 grams to 9 grams) and larger tubes (from Φ13 mm to Φ18 mm), the crystals' size increased simultaneously. It is also worth noting that the preferred morphology of as-grown single crystals has transformed from needle to plate, which facilitates device fabrication.

In addition, to further improve the crystal size, excess elemental I$_2$, Hg, and HgI$_2$ were also introduced with the starting materials besides PE. Vapor transport efficiency under PE and I$_2$ transport showed the highest transport efficiency compared to others combinations, such as Hg and PE, HgI$_2$ and PE. The thickness of the as-grown crystals could also be improved dramatically under PE and I$_2$ transport.

The type of transport agent also has an influence on the preferable morphology of as-grown crystals. The HgI$_2$ excess led to the formation of polycrystalline crystals, resulting in a low yield of single crystals. The vapor transport with PE and Hg gave rise to thinner crystal, but with an elongated shape. The edge of the crystals showed a serrated feature. The additional use of $I_2$ besides PE has led to the best transport results. All the $Hg_3Se_2I_2$ are transported to the cold side, compared to that transported with PE only, indicating excellent transport efficiency. The as-grown single crystal size was ~7×5×3.5 mm³. The thickness of the crystals was significantly enhanced to over 1 mm for most of the crystals. Therefore, the use of PE and $I_2$ and an appropriate temperature profile are both essential factors to obtain large single crystals during vapor transport.

During transport, the PE decomposed totally into a black carbon-based substance and specific gas species, such as of hydrogen and alkanes. Intermediate volatile species might also generate during the vapor transport and accelerate the transport process, such as $CH_3I$, $CH_3HgI$ and $CH_3SeSeCH_3$. The use of PE promotes the transport of Se atoms, which have a significantly smaller vapor pressure than Hg halides and also can balance the partial vapor pressure of each species to prevent the phase separation of Hg halide and Hg chalcogenide.

Figure 17A:
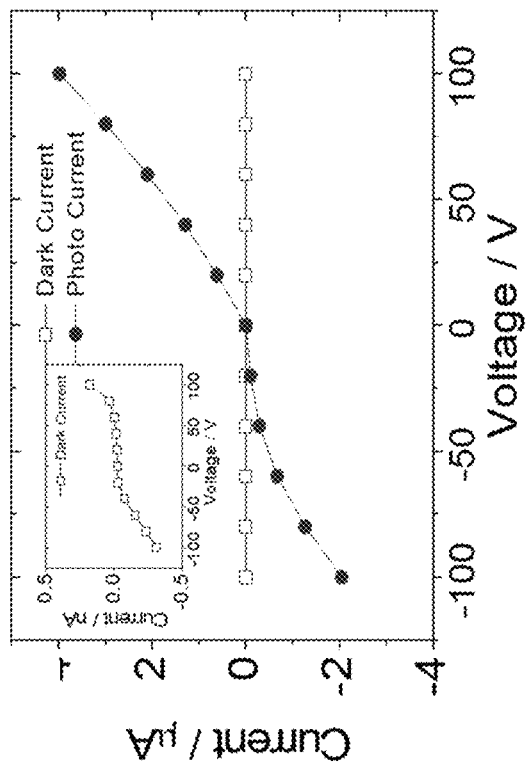
FIGS. 17A and 17B depict the photo response of $Hg_3Se_2I_2$ grown using 0.5% wt. % polyethylene (PE) and 0.5% wt. % iodine as transport agents.

Owing to their preferable plate-like morphology, the electrodes were prepared by using colloidal carbon or by evaporating Au film. There was no indication of a chemical reaction between Au or C and $Hg_3Se_2I_2$. The devices based on the single $Hg_3Se_2I_2$ crystals demonstrated considerable photoresponse under a light source (FIG. 17A). The intrinsic electrical resistivity of the crystal was over $10^{12}$ Ω·cm. The thickness of the crystal was 0.5 mm. Under the bias of 100 V the leakage current was less than 0.25 nA, while under white light (0.1~0.2 mW/cm²) the photocurrent was over 4 μA.

Figure 17B:
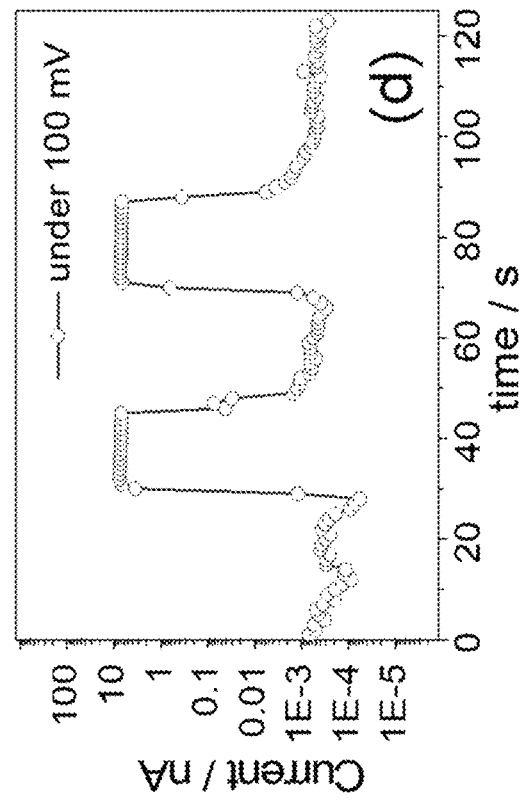

The device could also respond spontaneously at a high level, even at very low bias. The photoresponse under 100 mV corresponding to an electrical field of 2 V/cm (FIG. 17B) indicated the photocurrent was over 4 orders of magnitude above the dark current. This ON/OFF test also confirmed the reproducible, fast and steady photoresponse. It should be noted that the rise time and fall times largely determined the mechanical switch time interval (~1 s).

Figure 18:
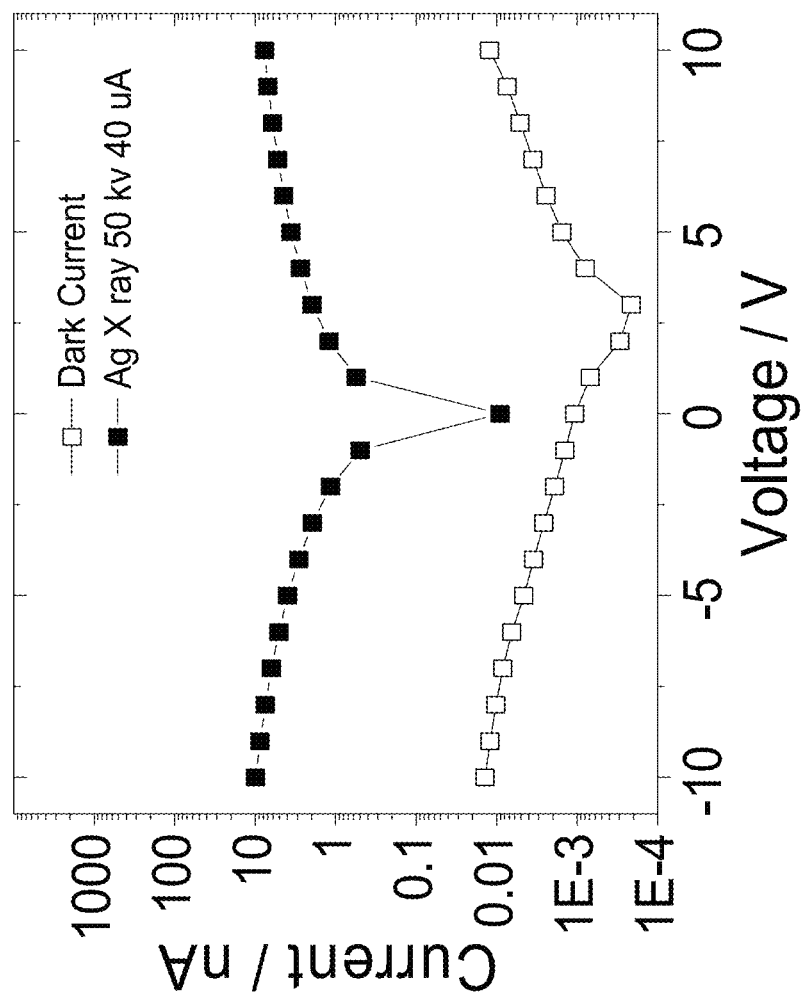
FIG. 18 depicts a device under Ag X-ray source (Mini-X X-Ray Tube from Amptek, Inc., where the collimator diameter is 1 mm with a distance of ~15 cm). The current under negative bias was intentionally converted to positive values for better illustration.

Under a low flux Ag X-ray source (tube voltage 50 KV and tube current 40 μA, approximately x photon/sec on the detector surface), the photocurrent was three orders higher over the dark current, indicating excellent photo sensitivity under a low energy X-ray source (FIG. 18). The large ON/OFF ratio facilitates an increase in the signal to noise (S/N) ratio during X-ray detection.

Figures 19A, 19B:
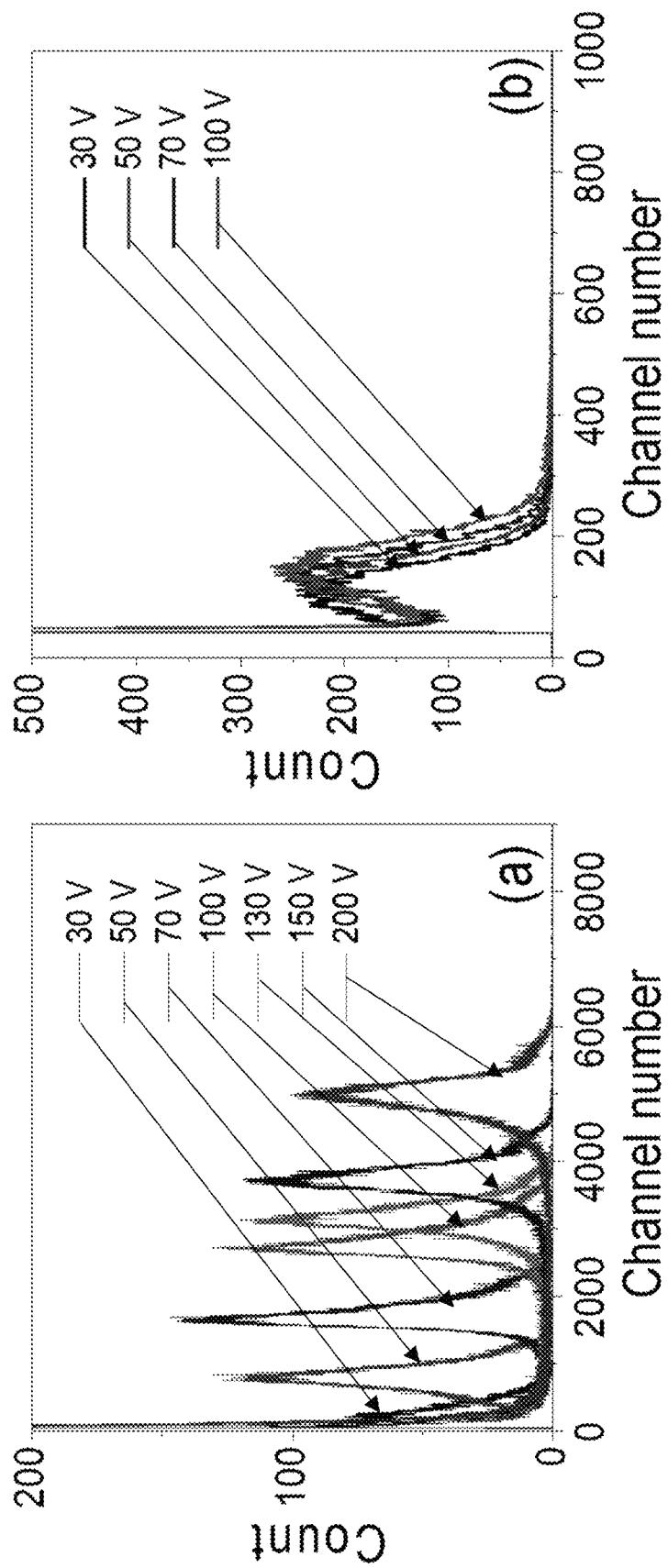
FIGS. 19A-19D depict the $^{241}Am$ alpha source (5.49 MeV) spectrum resolved by $Hg_3Se_2I_2$ grown by using 0.5% wt. % PE and 0.5% wt. % iodine as the transport agents.
Figures 19C, 19D:
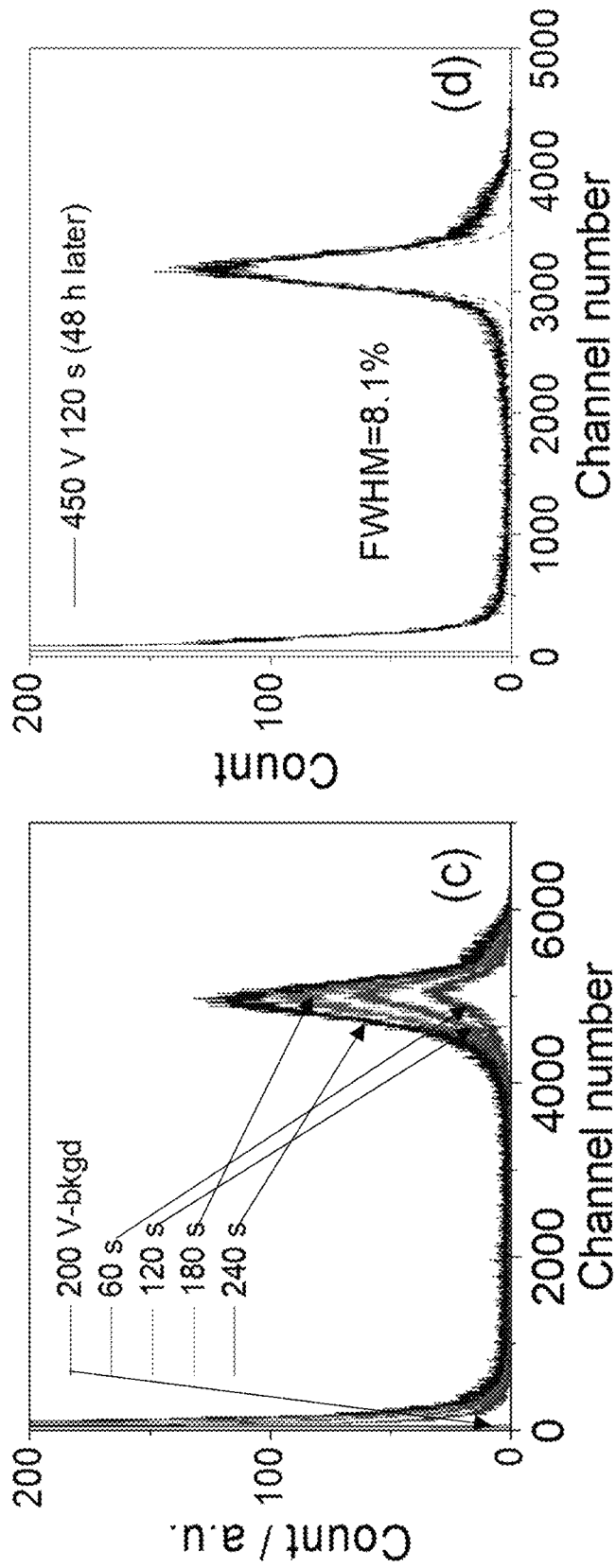

Under the $^{241}$Am α particle source, the $Hg_3Se_2I_2$ device showed greatly improved spectroscopic response. The typical kinetic energy for incident α particles is 5.49 MeV, and all the kinetic energy will be attenuated at the detector surface immediately to less than tens of micrometers. The cathode in FIG. 19A and the anode in FIG. 19B were under irradiation; thus, the measured signal was generated mainly by electron and hole drift through the thickness of the device, respectively. The spectra also indicated the distinct transport properties of the electrons and holes. While increasing the applied bias, the spectra shifted to the higher channel number, indicating the improvement of charge collection efficiency. Meanwhile, the full width at half maximum (FWHM) in percentage decreased from 50% at 50 V to 9% at 200 V. When the anode was under irradiation, the detector resolved the alpha peaks, but in lower channel numbers, indicating poor charge collection efficiency for holes. The time-dependent spectrum confirmed the stability of the device performance over 4 minutes (FIG. 19C). The best energy resolution under $^{241}$Am α particle source achieved was 8.1% when the champion device (~0.3 mm thickness) was biased at 450 V (FIG. 19D).

Figure 20C:
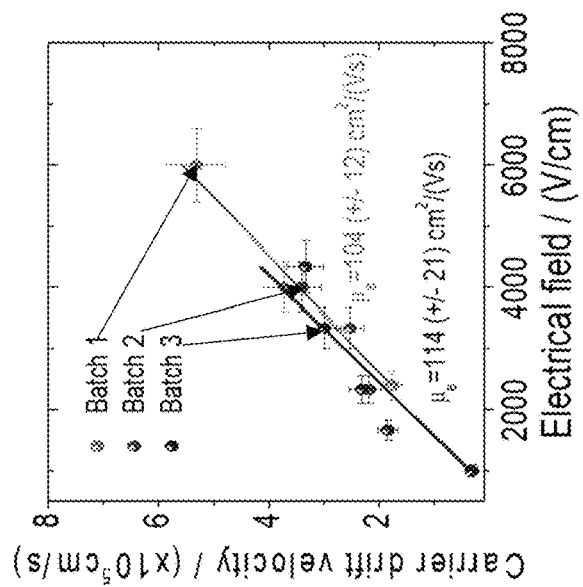
FIG. 20C shows the estimation of mobility for the electron of the $Hg_3Se_2I_2$ detector from different growth batches by linear fitting with the uncertainty of 10% (error bars). The median value of rise time was chosen to calculate as indicated in FIG. 20A.
Figure 20B:
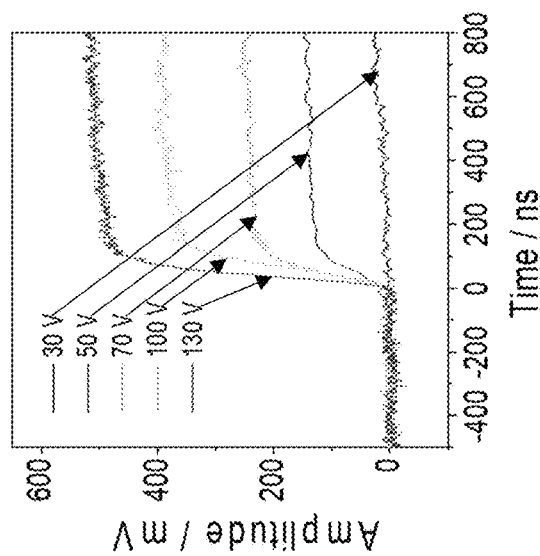
FIG. 20B shows that typical transient waveforms under various biases were obtained directly from the preamplifier.
Figure 20A:
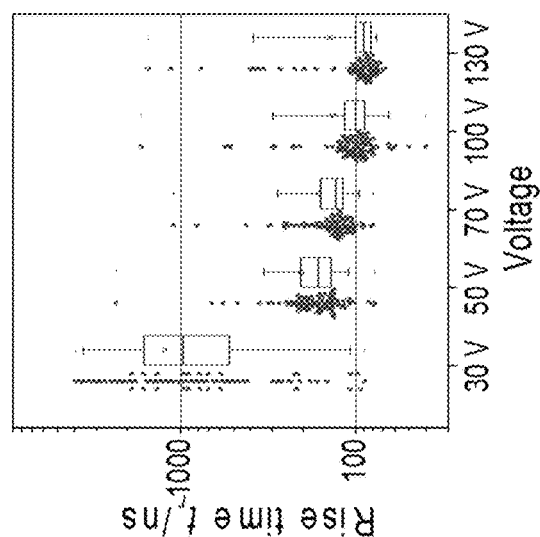
FIG. 20A shows a box chart of rise time data with scatter plot under various biases with the bottom and top of the box representing the 25th and 75th centiles.

The carrier drift mobilities of the crystals were evaluated using the rise time $t_r$ of transient waveforms from the preamplifier under $^{241}$Am α particle source. For photo-generated carriers drifting across the thickness, the mobility μ was given by $=d^2/Ut_r$, where U is the applied bias across the thickness d, and $t_r$ is the transit time of the carriers through the device. The rise times $t_r$ accordingly deceased with increasing bias, while their distribution narrowed and shifted toward smaller values as indicated in FIG. 20A. Under 130 V, the median rise time was only ~90 ns. The typical waveforms under various biases were extracted directly from preamplifier (FIG. 20B). The amplitude was enhanced with bias, implying higher charge collection efficiency. Subsequently, those waveforms were shaped further by the amplifier and then gave rise to the pulse height spectrum. The electron mobility values obtained from three growth batches appeared to be all around 100 cm²/(V·s) (FIG. 20C).

Figure 21A:
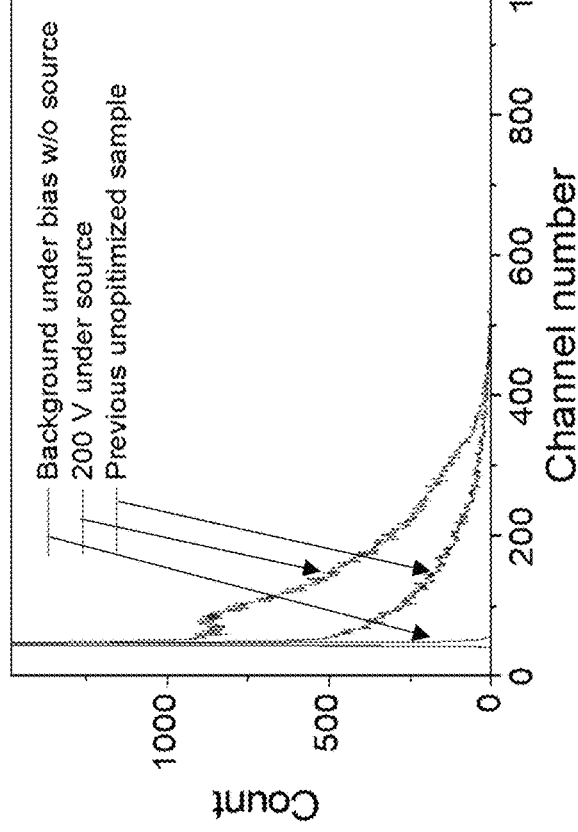
FIG. 21A. shows the gamma ray response under a 122 KeV $^{57}Co$ gamma ray source by $Hg_3Se_2I_2$ grown by using 0.5% wt. % polyethylene and 0.5% wt. % iodine as the transport agents.
Figure 21B:
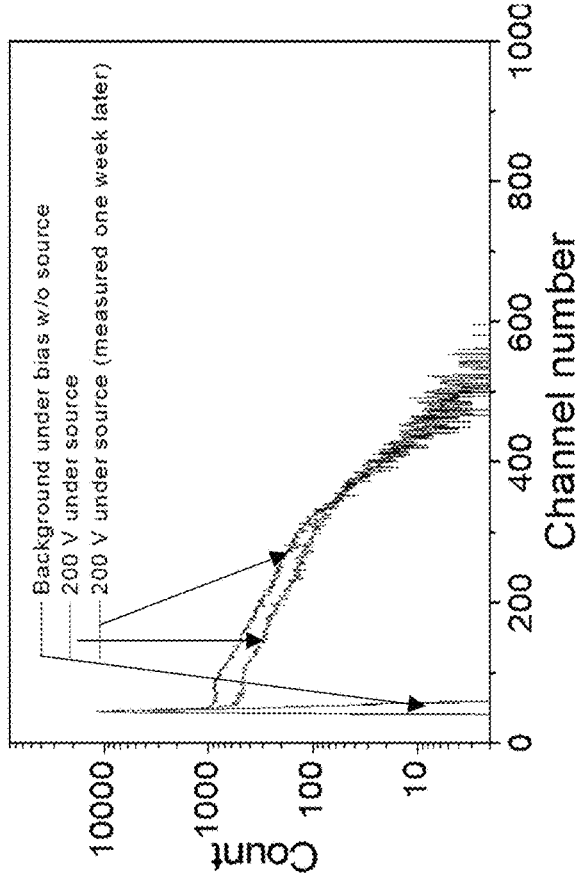
FIG. 21B shows a comparison of the gamma ray spectra over time.

Under a 122 KeV $^{57}$Co gamma ray source, the improved spectrum characteristic was obtained (FIG. 21A). Spectra were collected for 4 minutes at a bias of 200 V. In the linear scale the spectrum showed a very weak peak around channel number 100 and a shoulder around channel number 300. The advantage for $Hg_3Se_2I_2$ is its high electron mobility. It is generally believed that the carrier lifetime and mobility are inversely correlated to the concentration of ionized point defects. Thus, better stoichiometric control and purification is a practical approach to achieve the full potential of $Hg_3Se_2I_2$. Because of the small thickness of the detector, only a small part of the incident gamma ray interacts with the crystal through the dominated photoelectric interaction. According to the Shockley-Ramo theorem, if the incident gamma ray interacts randomly with the detector material across the whole depth of the thickness, the induced charge (depending on the weight potential) will vary linearly from zero to its maximum value, in which no spectroscopic information can be obtained.[15-16] After several days exposed in air and kept in dark without encapsulation, the device showed coincident response as the pristine one (FIG. 21B), indicating good stability of this compound against air and moisture.

Figure 21C:
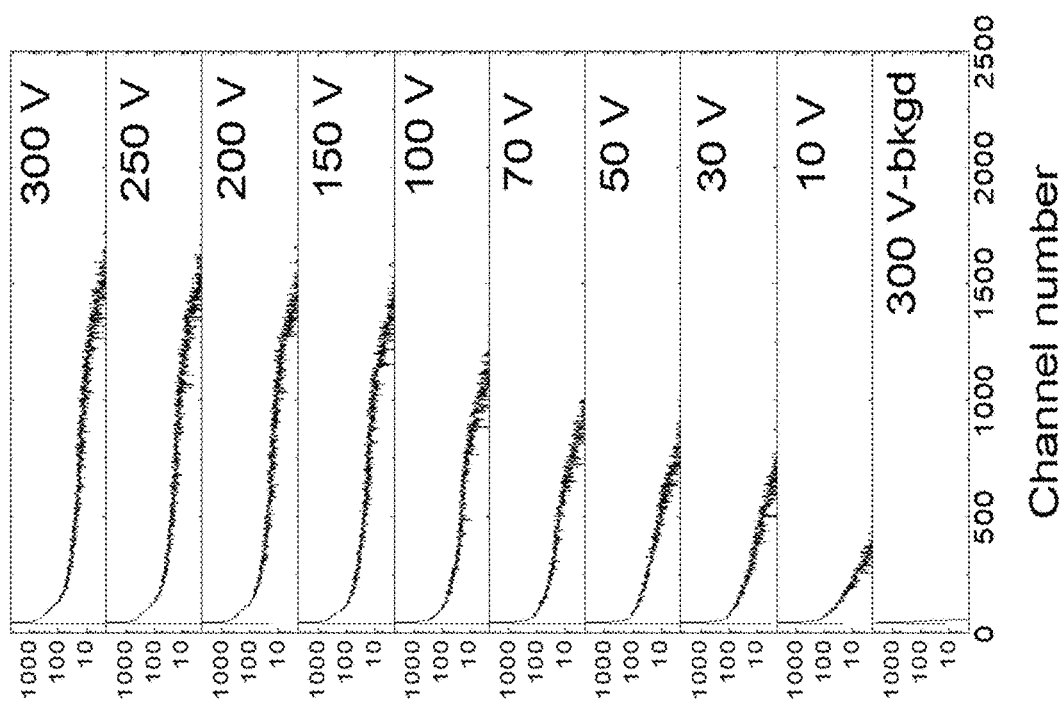
FIG. 21C shows the gamma ray response of $Hg_3Se_2I_2$ grown by using 0.5% wt. % polyethylene and 0.5% wt. % iodine as the transport agents under $^{241}Am$ 59.5 KeV gamma ray source.
Figures 21D, 21E:
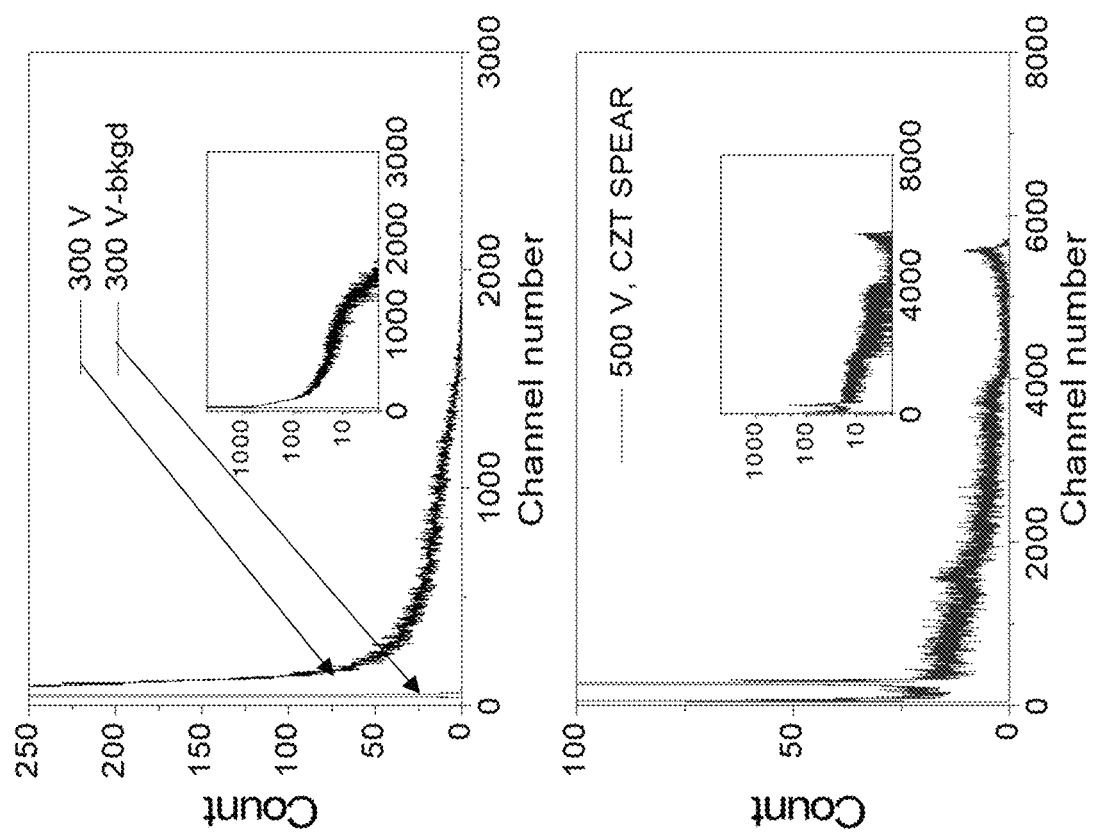
FIG. 21D shows the gamma ray response of $Hg_3Se_2I_2$ grown by using 0.5% wt. % polyethylene and 0.5% wt. % iodine as the transport agents under $^{57}$Co 122 KeV gamma ray source.
FIG. 21E shows the gamma ray response of $Hg_3Se_2I_2$ grown by using 0.5% wt. % polyethylene and 0.5% wt. % iodine as the transport agents under $^{137}$Cs 662 KeV gamma ray source.

Furthermore, under a 662 KeV $^{137}$Cs gamma ray source, the detector was also able to count the high-energy gamma rays. Under the same condition, a SPEAR CZT detector (5 mm thick) was used as a comparison. Owing to the higher atomic number and larger density, the interaction cross section for $Hg_3Se_2I_2$ was much higher than that of CZT. Even when the thickness of the $Hg_3Se_2I_2$ detector was ~0.3 mm, and the counting rate for both devices was comparable (FIG. 21D and FIG. 21E). The detector was almost saturated under a bias of 200 V (FIG. 21C).

REFERENCES

1. Takahashi, T., Recent Advances on CdTe/CdZnTe detectors. In *International Conference on New Developments In Photodetection* (*NDIP*08), 2008.
2. Russo, P.; Mettivier, G.; Pani, R.; Pellegrini, R.; Cinti, M. N.; Bennati, P., Imaging performance comparison between a LaBr3:Ce scintillator based and a CdTe semiconductor based photon counting compact gamma camera. *Medical physics* 2009, 36 (4), 1298-1317.
3. Peterson, T. E.; Furenlid, L. R., SPECT detectors: the Anger Camera and beyond. *Phys. Med. Biol.* 2011, 56 (17), R145-R182.
4. Owens, A.; Peacock, A., Compound semiconductor radiation detectors. *Nuclear Instruments and Methods in Phys-* ics Research Section A: Accelerators, Spectrometers, Detectors and Associated Equipment 2004, 531 (1-2), 18-37.
5. Schlesinger, T. E.; Toney, J. E.; Yoon, H.; Lee, E. Y.; Brunett, B. A.; Franks, L.; James, R. B., Cadmium zinc telluride and its use as a nuclear radiation detector material. *Materials Science and Engineering: R: Reports* 2001, 32 (4-5), 103-189.
6. Androulakis, J.; Peter, S. C.; Li, H.; Malliakas, C. D.; Peters, J. A.; Liu, Z.; Wessels, B. W.; Song, J.-H.; Jin, H.; Freeman, A. J.; Kanatzidis, M. G., Dimensional Reduction: A Design Tool for New Radiation Detection Materials. *Adv. Mater.* 2011, 23 (36), 4163-4167.
7. Johnsen, S.; Liu, Z.; Peters, J. A.; Song, J.-H.; Nguyen, S.; Malliakas, C. D.; Jin, H.; Freeman, A. J.; Wessels, B. W.; Kanatzidis, M. G., Thallium Chalcohalides for X-ray and γ-ray Detection. *J. Am. Chem. Soc.* 2011, 133 (26), 10030-10033.
8. Kahler, D.; Singh, N. B.; Knuteson, D. J.; Wagner, B.; Berghmans, A.; McLaughlin, S.; King, M.; Schwartz, K.; Suhre, D.; Gotlieb, M., Performance of novel materials for radiation detection: Tl3AsSe3, TlGaSe2, and Tl4HgI6. *Nuclear Instruments and Methods in Physics Research Section A: Accelerators, Spectrometers, Detectors and Associated Equipment* 2011, 652 (1), 183-185.
9. McGregor, D. S.; Hermon, H., Room-temperature compound semiconductor radiation detectors. *Nuclear Instruments and Methods in Physics Research Section A: Accelerators, Spectrometers, Detectors and Associated Equipment* 1997, 395 (1), 101-124.
10. Chen, H.; Kim, J.-S.; Amarasinghe, P.; Palosz, W.; Jin, F.; Trivedi, S.; Burger, A.; Marsh, J. C.; Litz, M. S.; Wiejewarnasuriya, P. S.; Gupta, N.; Jensen, J.; Jensen, J. In *Novel semiconductor radiation detector based on mercurous halides*, 2015; pp 95930G-95930G-11.
11. Roy, U. N.; Camarda, G. S.; Cui, Y; Gu, G.; Gul, R.; Hossain, A.; Yang, G.; Egarievwe, S. U.; James, R. B., Growth and characterization of CdMnTe by the vertical Bridgman technique. *J. Cryst. Growth* 2016, 437, 53-58.
12. Saito, T.; Iwasaki, T.; Kurosawa, S.; Yoshikawa, A.; Den, T., BiI3 single crystal for room-temperature gamma ray detectors. *Nuclear Instruments and Methods in Physics Research Section A: Accelerators, Spectrometers, Detectors and Associated Equipment* 2016, 806, 395-400.
13. Lordi, V.; Åberg, D.; Erhart, P.; Wu, K. J. In *First principles calculation of point defects and mobility degradation in bulk AlSb for radiation detection application*, 2007; pp 67060O-67060O-12.
14. Szeles, C.; Cameron, S. E.; Ndap, J. O.; Chalmers, W. C., Advances in the crystal growth of semi-insulating CdZnTe for radiation detector applications. *Nuclear Science, IEEE Transactions on* 2002, 49 (5), 2535-2540.
15. Bolotnikov, A. E.; Camarda, G. S.; Cui, Y; De Geronimo, G.; Eger, J.; Emerick, A.; Fried, J.; Hossain, A.; Roy, U.; Salwen, C.; Soldner, S.; Vernon, E.; Yang, G.; James, R. B., Use of high-granularity CdZnTe pixelated detectors to correct response non-uniformities caused by defects in crystals. *Nuclear Instruments and Methods in Physics Research Section A: Accelerators, Spectrometers, Detectors and Associated Equipment* 2016, 805, 41-54.
16. Koehler, W.; Thrall, C.; Zhong, H.; Kim, H.; Cirignano, L.; Shah, K. In *Spectroscopic performance of recent TlBr detectors*, Nuclear Science Symposium and Medical Imaging Conference (NSS/MIC), 2012 IEEE, Oct. 27 2012-Nov. 3 2012; 2012; pp 4245-4248.
17. Burger, A.; Nason, D.; Franks, L., Mercuric iodide in prospective. *J. Cryst. Growth* 2013, 379 (0), 3-6.
18. Datta, A.; Becla, P.; Moed, D.; Motakef, S. In *Performance limiting processes in room temperature thallium bromide radiation detectors*, 2015; pp 95930E-95930E-11.
19. Axtell, E. A.; Liao, J.-H.; Pikramenou, Z.; Kanatzidis, M. G., Dimensional reduction in II-VI materials: A2Cd3Q4 (A=K, Q=S, Se, Te; A=Rb, Q=S, Se), novel ternary low-dimensional cadmium chalcogenides produced by incorporation of A2Q in CdQ. *Chemistry—A European Journal* 1996, 2 (6), 656-666.
20. Johnsen, S.; Peter, S. C.; Nguyen, S. L.; Song, J.-H.; Jin, H.; Freeman, A. J.; Kanatzidis, M. G., Tl2Hg3Q4 (Q=S, Se, and Te): High-Density, Wide-Band-Gap Semiconductors. *Chem. Mater.* 2011, 23 (19), 4375-4383.
21. Nguyen, S. L.; Malliakas, C. D.; Peters, J. A.; Liu, Z.; Im, J.; Zhao, L.-D.; Sebastian, M.; Jin, H.; Li, H.; Johnsen, S.; Wessels, B. W.; Freeman, A. J.; Kanatzidis, M. G., Photoconductivity in Tl6SI4: A Novel Semiconductor for Hard Radiation Detection. *Chem. Mater.* 2013, 25 (14), 2868-2877.
22. Li, H.; Peters, J. A.; Liu, Z.; Sebastian, M.; Malliakas, C. D.; Androulakis, J.; Zhao, L.; Chung, I.; Nguyen, S. L.; Johnsen, S.; Wessels, B. W.; Kanatzidis, M. G., Crystal Growth and Characterization of the X-ray and γ-ray Detector Material Cs2Hg6S7. *Crystal Growth & Design* 2012, 12 (6), 3250-3256.
23. Islam, S. M.; Vanishri, S.; Li, H.; Stoumpos, C. C.; Peters, J. A.; Sebastian, M.; Liu, Z.; Wang, S.; Haynes, A. S.; Im, J.; Freeman, A. J.; Wessels, B.; Kanatzidis, M. G., Cs2Hg3S4: A Low-Dimensional Direct Bandgap Semiconductor. *Chem. Mater.* 2015, 27 (1), 370-378.
24. Wang, S.; Liu, Z.; Peters, J. A.; Sebastian, M.; Nguyen, S. L.; Malliakas, C. D.; Stoumpos, C. C.; Im, J.; Freeman, A. J.; Wessels, B. W.; Kanatzidis, M. G., Crystal Growth of Tl4CdI6: A Wide Band Gap Semiconductor for Hard Radiation Detection. *Crystal Growth & Design* 2014, 14 (5), 2401-2410.
25. Deng, Z.; Radhakrishnan, B.; Ong, S. P., Rational Composition Optimization of the Lithium-Rich Li3OCl1-xBrx Anti-Perovskite Superionic Conductors. *Chem. Mater.* 2015, 27 (10), 3749-3755.
26. Nguyen, H.; Hy, S.; Wu, E.; Deng, Z.; Samiee, M.; Yersak, T.; Luo, J.; Ong, S. P.; Meng, Y. S., Experimental and Computational Evaluation of a Sodium-Rich Anti-Perovskite for Solid State Electrolytes. *J. Electrochem. Soc.* 2016, 163 (10), A2165-A2171.
27. Chern, M. Y.; Disalvo, F. J.; Parise, J. B.; Goldstone, J. A., The structural distortion of the anti-perovskite nitride Ca3AsN. *J. Solid State Chem.* 1992, 96 (2), 426-435.
28. Stadelmaier, H. H.; Huetter, L. J., Ternary carbides of the transition metals nickel, cobalt, iron, manganese with zinc and tin. *Acta Metall.* 1959, 7 (6), 415-419.
29. Valldor, M.; Wright, T.; Fitch, A.; Prots, Y., Metal Vacancy Ordering in an Antiperovskite Resulting in Two Modifications of Fe2SeO. *Angew. Chem. Int. Ed.* 2016, 55 (32), 9380-9383.
30. Kostina, S. S.; Peters, J. A.; Lin, W.; Chen, P.; Liu, Z.; Wang, P. L.; Kanatzidis, M. G.; Wessels, B. W., Photoluminescence fatigue and inhomogeneous line broadening in semi-insulating Tl 6 SeI 4 single crystals. *Semicond. Sci. Technol.* 2016, 31 (6), 065009.
31. Kresse, G.; Furthmuller, J., Efficient iterative schemes for ab initio total-energy calculations using a plane-wave basis set. *Phys. Rev. B Condens Matter.* 1996, 54 (16), 11169-11186.
32. Kresse, G.; Hafner, J., Ab initio molecular-dynamics simulation of the liquid-metal-amorphous-semiconductor 32. transition in germanium. *Phys. Rev. B Condens Matter.* 1994, 49 (20), 14251-14269.
33. Perdew, J. P.; Burke, K.; Ernzerhof, M., Generalized gradient approximation made simple. *Phy. Rev. Lett.* 1996, 77 (18), 3865-3868.
34. Knoll, G. F., *Radiation Detection and Measurement.* John Wiley & Sons, Inc.: 1999.
35. Svetlana, A. M.; Natal'ya, V. P.; Stanislav, V. B.; Nadezhda, A. P. c., Crystal chemistry and features of the structure formation of mercury oxo- and chalcohalides. *Russ. Chem. Rev.* 2007, 76 (2), 101.
36. Beck, J.; Hedderich, S., Synthesis and Crystal Structure of Hg3S2I2 and Hg3Se2I2, New Members of the Hg3E2X2 Family. *J. Solid State Chem.* 2000, 151 (1), 73-76.
37. Li, H.; Meng, F.; Malliakas, C. D.; Liu, Z.; Chung, D. Y.; Wessels, B.; Kanatzidis, M. G., Mercury Chalcohalide Semiconductor Hg3 Se2Br2 for Hard Radiation Detection. *Crystal Growth & Design* 2016, 16 (11), 6446-6453.
38. Miyake, S.; Ueda, R., On Phase Transformation of BaTiO3. *J. Phys. Soc. Jpn.* 1947, 2 (5), 93-97.
39. Braun, R. M.; Hoppe, R., The First Oxostannate(II): K2Sn2O3. *Angewandte Chemie International Edition in English* 1978, 17 (6), 449-450.
40. Tomashyk; V; Feychuk; P.; Shcherbak, L., *Ternary Alloys Based on II-VI Semiconductor Compounds*. CRC Press: 2013.
41. Binnewies, M.; Glaum, R.; Schmidt, M.; Schmidt, P., Chemical Vapor Transport Reactions—A Historical Review. *Z. Anorg. Allg. Chem.* 2013, 639 (2), 219-229.
42. Mikami, M.; Eto, T.; Wang, J.; Masa, Y.; Isshiki, M., Growth of zinc oxide by chemical vapor transport. *J. Cryst. Growth* 2005, 276 (3-4), 389-392.
43. McGregor, D. S.; Ariesanti, E., Platelet growth of mercuric iodide. *J. Cryst. Growth* 2013, 379, 7-15.
44. Chen, K.-T.; George, M. A.; Zhang, Y.; Burger, A.; Su, C.-H.; Sha, Y-G.; Gillies, D. C.; Lehoczky, S. L., Selenium precipitation in ZnSe crystals grown by physical vapor transport. *J. Cryst. Growth* 1995, 147 (3-4), 292-296.
45. Li, H.; Jie, W., Growth and characterizations of bulk ZnSe single crystal by chemical vapor transport. *J. Cryst. Growth* 2003, 257 (1-2), 110-115.
46. Wu, H.; Konkapaka, P.; Makarov, Y.; Spencer, M. G., Bulk GaN growth by Gallium Vapor Transport technique. *physica status solidi (c)* 2005, 2 (7), 2032-2035.
47. Dhanasekaran, R., Growth of Semiconductor Single Crystals from Vapor Phase. In *Springer Handbook of Crystal Growth*, Dhanaraj, G.; Byrappa, K.; Prasad, V; Dudley, M., Eds. Springer Berlin Heidelberg: Berlin, Heidelberg, 2010; pp 897-935.
48. Hutchins, M. A.; Wiedemeier, H., The Equilibrium Partial Pressure of HgI2 over and Thermodynamic Properties of Hg3Te2I2I). *Z. Anorg. Allg. Chem.* 2006, 632 (2), 211-227.
49. Newnham, R. E., *Properties of materials: anisotropy, symmetry, structure*. Oxford University Press on Demand: 2005.
50. Malliakas, C. D.; Wibowo, A. C.; Liu, Z.; Peters, J. A.; Sebastian, M.; Jin, H.; Chung, D.-Y; Freeman, A. J.; Wessels, B. W.; Kanatzidis, M. G. In *Mercury and antimony chalcohalide semiconductors as new candidates for radiation detection applications at room temperature,* 2012; pp 85070F-85070E-7.
51. Sekerka, R. F., Equilibrium and growth shapes of crystals: how do they differ and why should we care? *Cryst. Res. Technol.* 2005, 40 (4-5), 291-306.
52. Schmidt, T.; Lischka, K.; Zulehner, W., Excitation-power dependence of the near-band-edge photoluminescence of semiconductors. *Phys. Rev. B* 1992, 45 (16), 8989-8994.
53. Bube, R. H., *Photoelectronic Properties of Semiconductors*. Cambridge University Press: Cambridge, England, 1992; p 318.
54. Seltzer, S. M., Calculation of Photon Mass Energy-Transfer and Mass Energy-Absorption Coefficients. *Radiation Research* 1993, 136 (2), 147-170.
55. Rodnyi, P. A., *Physical processes in inorganic scintillators*. CRC Press: Boca Raton, 1997; p 219 p.
56. Zhong, H., Review of the Shockley-Ramo theorem and its application in semiconductor gamma-ray detectors. *Nuclear Instruments and Methods in Physics Research Section A: Accelerators, Spectrometers, Detectors and Associated Equipment* 2001, 463 (1-2), 250-267.
57. Shah, K. S.; Lund, J. C.; Olschner, F.; Moy, L.; Squillante, M. R., Thallium bromide radiation detectors. *IEEE Trans. Nucl. Sci.* 1989, 36 (1), 199-202.
58. Shockley, W., Currents to Conductors Induced by a Moving Point Charge. *J. Appl. Phys.* 1938, 9 (10), 635-636.
59. Krishna, R. M.; Chaudhuri, S. K.; Zavalla, K. J.; Mandal, K. C., Characterization of Cd0.9Zn0.1Te based virtual Frisch grid detectors for high energy gamma ray detection. *Nucl. Instrum. Methods Phys. Res. Sect. A-Accel. Spectrom. Dect. Assoc. Equip.* 2013, 701, 208-213.
60. Prettyman, T.; Cooper, C.; Luke, P.; Russo, P.; Amman, M.; Mercer, D., Physics-based generation of gamma-ray response functions for CdZnTe detectors. *J. Radioanal. Nucl. Chem.* 1998, 233 (1), 257-264.
61. He, Z.; Knoll, G. F.; Wehe, D. K., Direct measurement of product of the electron mobility and mean free drift time of CdZnTe semiconductors using position sensitive single polarity charge sensing detectors. *J. Appl. Phys.* 1998, 84 (10), 5566-5569.
62. Sellin, P. J.; Davies, A. W.; Lohstroh, A.; Ozsan, M. E.; Parkin, J., Drift mobility and mobility-lifetime products in CdTe: Cl grown by the travelling heater method. *IEEE Trans. Nucl. Sci.* 2005, 52 (6), 3074-3078.
63. Szeles, C., CdZnTe and CdTe materials for X-ray and gamma ray radiation detector applications. *physica status solidi (b)* 2004, 241 (3), 783-790.
64. Holzer, A.; Schieber, M., Reduction of Polarization in Mercuric Iodide Nuclear Radiation Detectors. *Nuclear Science, IEEE Transactions on* 1980, 27 (1), 266-271.
65. Gerrish, V, Polarization and gain in mercuric iodide gamma-ray spectrometers. *Nuclear Instruments and Methods in Physics Research Section A: Accelerators, Spectrometers, Detectors and Associated Equipment* 1992, 322 (3), 402-413.
66. Ahuja, R.; Arwin, H.; Ferreira da Silva, A.; Persson, C.; Osorio-Guillén, J. M.; Souza de Almeida, J.; Moyses Araujo, C.; Veje, E.; Veissid, N.; An, C. Y; Pepe, I.; Johansson, B., Electronic and optical properties of lead iodide. *J. Appl. Phys.* 2002, 92 (12), 7219-7224.
67. Madelung, O., Semiconductors: Data Handbook: IV-VII2 compounds. In *Semiconductors: Data Handbook*, Springer Berlin Heidelberg: Berlin, Heidelberg, 2004; pp 606-612.
68. Chang, Y.-C.; James, R. B., Electronic and optical properties of HgI2. *Physical Review B* 1992, 46 (23), 15040-15045.
69. van den Berg, L.; Alexander, W. B.; Pohl, K. R.; Sandoval, J. S. In *Measurement of charge carrier properties in mercuric iodide,* 2005; pp 59220P-59220P-7.

70. Adducci, F.; Baldassarre, L.; Minafra, A., Mobility anisotropy determination by the photoelectromagnetic effect: Application to HgI2. *J. Appl. Phys.* 1978, 49 (12), 6179-6181.
71. Baskar, K.; Gobinathan, R., Growth and microhardness studies of mercuric iodide single crystals. *J. Mater. Sci. Lett.* 1989, 8 (5), 581-583.
72. Datta, A.; Moed, D.; Becla, P.; Overholt, M.; Motakef, S., Advances in Crystal Growth, Device Fabrication and Characterization of Thallium Bromide Detectors for Room Temperature Applications. *J. Cryst. Growth* 2016.
73. Setyawan, W.; Gaume, R. M.; Lam, S.; Feigelson, R. S.; Curtarolo, S., High-Throughput Combinatorial Database of Electronic Band Structures for Inorganic Scintillator Materials. *ACS Combinatorial Science* 2011, 13 (4), 382-390.
74. Hitomi, K.; Matsumoto, M.; Muroi, O.; Shoji, T.; Hiratate, Y, Characterization of thallium bromide crystals for radiation detector applications. *J. Cryst. Growth* 2001, 225 (2-4), 129-133.
75. Churilov, A. V.; Ciampi, G.; Kim, H.; Higgins, W. M.; Cirignano, L. J.; Olschner, F.; Biteman, V.; Minchello, M.; Shah, K. S., TlBr and TlBrxI1-x crystals for γ-ray detectors. *J. Cryst. Growth* 2010, 312 (8), 1221-1227.
76. Shorohov, M.; Muktepavela, F.; Grigorjeva, L.; Maniks, J.; Millers, D., Surface processing of TlBr single crystals used for radiation detectors. *Nuclear Instruments and Methods in Physics Research Section A: Accelerators, Spectrometers, Detectors and Associated Equipment* 2009, 607 (1), 120-122.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of making a single-crystal of an inorganic compound having the formula $Hg_3Q_2I_2$, where Q represents a chalcogen atom or a combination of chalcogen atoms, the method comprising growing the single-crystal from two or more precursors selected from HgQ, $HgI_2$, Hg, Q, and $I_2$ via chemical vapor transport growth in the presence of an organic polymer vapor transport agent.

2. The method of claim 1, wherein the organic polymer vapor transport agent is polyethylene.

3. The method of claim 1, wherein Q represents Se.

4. The method of claim 3, wherein the chemical vapor transport growth is carried out in the presence of the organic polymer vapor transport agent and an iodine transport agent.

5. The method of claim 4, wherein the organic polymer vapor transport agent is polyethylene.

6. The method of claim 1, wherein the precursors are the HgQ and the $HgI_2$.

7. The method of claim 6, wherein Q represents Se.

8. The method of claim 1, wherein the chemical vapor transport is carried out in a tube having a source end containing the precursors, the source end having a temperature in the range from 460° C. to 330° C., and a cold end where the single-crystal of the inorganic compound having the formula $Hg_3Q_2I_2$ is formed, the cold end having a temperature that is from 10° C. to 150° C. lower than the temperature of the source end.

9. The method of claim 1, wherein the single-crystal of the inorganic compound having the formula $Hg_3Q_2I_2$ has at least one lateral dimension of at least 5 mm.

10. The method of claim 9, wherein the single-crystal of the inorganic compound having the formula $Hg_3Q_2I_2$ has an aspect ratio of no greater than 5.

11. The method of claim 10, wherein the single-crystal of the inorganic compound having the formula $Hg_3Q_2I_2$ has a thickness of at least 0.5 mm.

12. The method of claim 11, wherein Q represents Se.

13. The method of claim 1, wherein the single-crystal of the inorganic compound having the formula $Hg_3Q_2I_2$ has at least one lateral dimension of at least 1 cm.

14. The method of claim 13, wherein the single-crystal of the inorganic compound having the formula $Hg_3Q_2I_2$ has an aspect ratio of no greater than 2.

15. The method of claim 14, wherein the single-crystal of the inorganic compound having the formula $Hg_3Q_2I_2$ has a thickness of at least 2 mm.

16. The method of claim 15, wherein Q represents Se.

17. The method of claim 1, wherein the organic polymer vapor transport agent is a C3 to C6 polyolefin.

* * * * *